(12) United States Patent
Park et al.

(10) Patent No.: US 10,243,040 B1
(45) Date of Patent: Mar. 26, 2019

(54) SEMICONDUCTOR DEVICE

(71) Applicant: SAMSUNG ELECTRONICS CO., LTD., Suwon-si, Gyeonggi-do (KR)

(72) Inventors: Woo Seok Park, Ansan-si (KR); Seung Min Song, Hwaseong-si (KR); Jung Gil Yang, Hwaseong-si (KR); Geum Jong Bae, Suwon-si (KR); Dong Il Bae, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/964,170

(22) Filed: Apr. 27, 2018

(30) Foreign Application Priority Data

Oct. 18, 2017 (KR) .................. 10-2017-0135333

(51) Int. Cl.
| | |
|---|---|
| *H01L 29/66* | (2006.01) |
| *H01L 29/06* | (2006.01) |
| *H01L 29/78* | (2006.01) |
| *H01L 29/417* | (2006.01) |

(52) U.S. Cl.
CPC .... *H01L 29/0642* (2013.01); *H01L 29/41791* (2013.01); *H01L 29/66795* (2013.01); *H01L 29/785* (2013.01)

(58) Field of Classification Search
CPC ......... H01L 29/66545; H01L 29/66795; H01L 29/785; H01L 27/0886; H01L 27/0924
See application file for complete search history.

(56) References Cited

U.S. PATENT DOCUMENTS

| | | | |
|---|---|---|---|
| 9,209,095 B2 | 12/2015 | Chang et al. | |
| 9,263,583 B2 | 2/2016 | Cai et al. | |
| 9,306,019 B2 | 4/2016 | Wan et al. | |
| 9,455,250 B1* | 9/2016 | Cheng | H01L 29/6681 |
| 9,576,856 B2 | 2/2017 | Zang et al. | |
| 9,595,525 B2 | 3/2017 | Cheng et al. | |
| 9,601,569 B1 | 3/2017 | Suk et al. | |
| 2006/0024874 A1 | 2/2006 | Yun et al. | |
| 2015/0372104 A1 | 12/2015 | Liu et al. | |
| 2016/0079367 A1* | 3/2016 | Yoo | H01L 29/785 257/77 |
| 2017/0005195 A1* | 1/2017 | Ching | H01L 29/7848 |
| 2018/0006030 A1* | 1/2018 | Cheng | H01L 29/66545 |

\* cited by examiner

*Primary Examiner* — Jaehwan Oh
*Assistant Examiner* — John M Parker
(74) *Attorney, Agent, or Firm* — Lee & Morse, P.C.

(57) ABSTRACT

A semiconductor device including a transistor disposed on a first region of a substrate, the transistor including source/drain regions, a plurality of channel layers spaced apart from each other in a direction perpendicular to an upper surface of the substrate while connecting the source/drain regions, respectively, a gate electrode surrounding each of the plurality of channel layers, and a gate insulator between the gate electrode and the plurality of channel layers; and a non-active component disposed on a second region of the substrate, the non-active component including a fin structure including an a plurality of first semiconductor patterns alternately stacked with a plurality of second semiconductor patterns, an epitaxial region adjacent to the fin structure, a non-active electrode intersecting the fin structure, and a blocking insulation film between the non-active electrode and the fin structure.

20 Claims, 18 Drawing Sheets

US 10,243,040 B1

SEMICONDUCTOR DEVICE

CROSS-REFERENCE TO RELATED APPLICATION(S)

Korean Patent Application No. 10-2017-0135333 filed on Oct. 18, 2017 in the Korean Intellectual Property Office, and entitled: "Semiconductor Device," is incorporated by reference herein in its entirety.

BACKGROUND

1. Field

Embodiments relate to a semiconductor device.

2. Description of the Related Art

In recent years, the downscaling of semiconductor devices has proceeded rapidly.

SUMMARY

The embodiments may be realized by providing a semiconductor device including a transistor disposed on a first region of a substrate, the transistor including source/drain regions, a plurality of channel layers spaced apart from each other in a direction perpendicular to an upper surface of the substrate while connecting the source/drain regions, respectively, a gate electrode surrounding each of the plurality of channel layers, and a gate insulator between the gate electrode and the plurality of channel layers; and a non-active component disposed on a second region of the substrate, the non-active component including a fin structure including a plurality of first semiconductor patterns alternately stacked with a plurality of second semiconductor patterns, an epitaxial region adjacent to the fin structure, a non-active electrode intersecting the fin structure, and a blocking insulation film between the non-active electrode and the fin structure.

The embodiments may be realized by providing a semiconductor device including a transistor on a first region of a substrate, the transistor including source/drain regions arranged in a first direction, a plurality of channel layers arranged in a direction perpendicular to an upper surface of the substrate and spaced apart from each other while connecting the source/drain regions, a gate electrode extending in a second direction, intersecting the first direction, while surrounding the plurality of channel layers, and a gate insulator between the gate electrode and the plurality of channel layers; a non-active component on a second region of the substrate, the non-active component including a fin structure including a plurality of first semiconductor patterns alternately stacked with a plurality of second semiconductor patterns, an epitaxial region disposed in the first direction and adjacent to the fin structure, a non-active electrode extending in the second direction while intersecting the fin structure, and a blocking insulation film between the non-active electrode and the fin structure, the blocking insulation film being formed of a material different from that of the first semiconductor patterns; and a plurality of contact plugs connected to the source/drain regions and the epitaxial region.

The embodiments may be realized by providing a semiconductor device including a first transistor on a first conductive well of a substrate, the first transistor including first source/drain regions, a plurality of first channel layers spaced apart from each other in a direction perpendicular to an upper surface of the substrate while connecting the first source/drain regions, respectively, a first gate electrode surrounding each of the plurality of first channel layers, and a first gate insulator between the first gate electrode and the plurality of first channel layers; a second transistor on a second conductive well of the substrate, the second transistor including second source/drain regions, a plurality of second channel layers spaced apart from each other in the direction perpendicular to the upper surface of the substrate while connecting the second source/drain regions, respectively, a second gate electrode surrounding each of the plurality of second channel layers, and a second gate insulator between the second gate electrode and the plurality of second channel layers; and a non-active component on the second conductive well of the substrate, the non-active component including a fin structure including a plurality of first semiconductor patterns alternately stacked with a plurality of second semiconductor patterns, an epitaxial region adjacent to the fin structure, a non-active electrode disposed to intersect the fin structure, and a blocking insulation film between the non-active electrode and the fin structure, the blocking insulation film being formed of a material that is different from that of the first semiconductor patterns.

BRIEF DESCRIPTION OF DRAWINGS

Features will be apparent to those of skill in the art by describing in detail exemplary embodiments with reference to the attached drawings in which.

DETAILED DESCRIPTION

Figure 1:
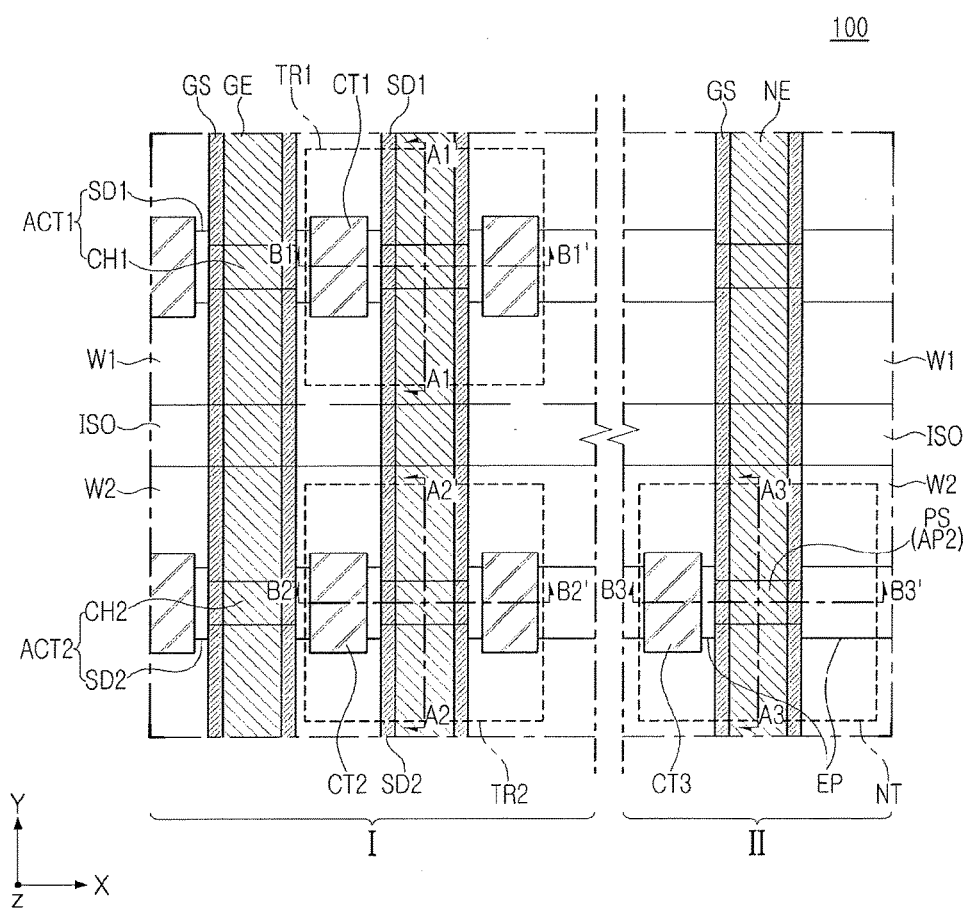
FIG. 1 illustrates a plan view of a semiconductor device according to an example embodiment.
Figure 2A:
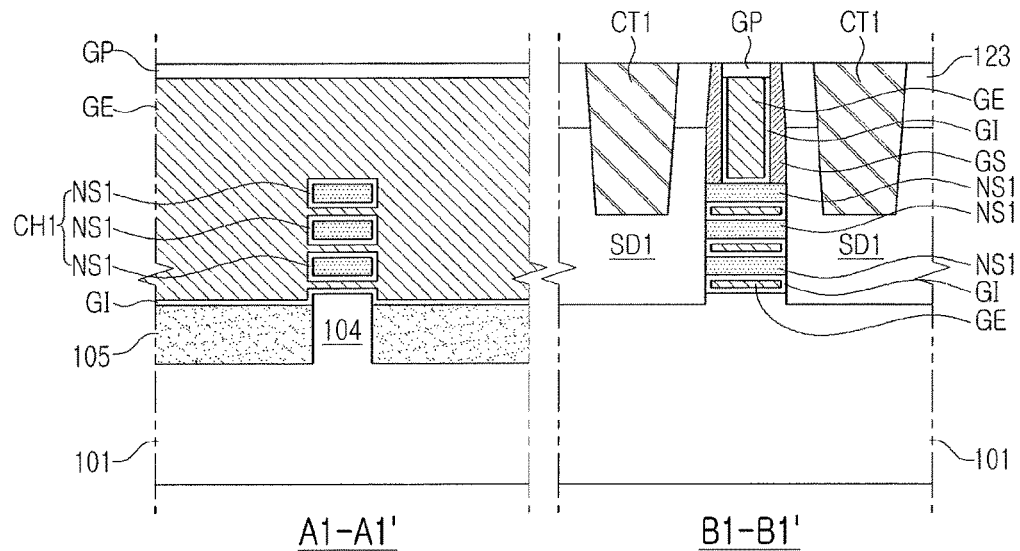
FIG. 2A illustrates cross-sectional views taken along line A1-A1' and line B1-B1' of FIG. 1.
Figure 2B:
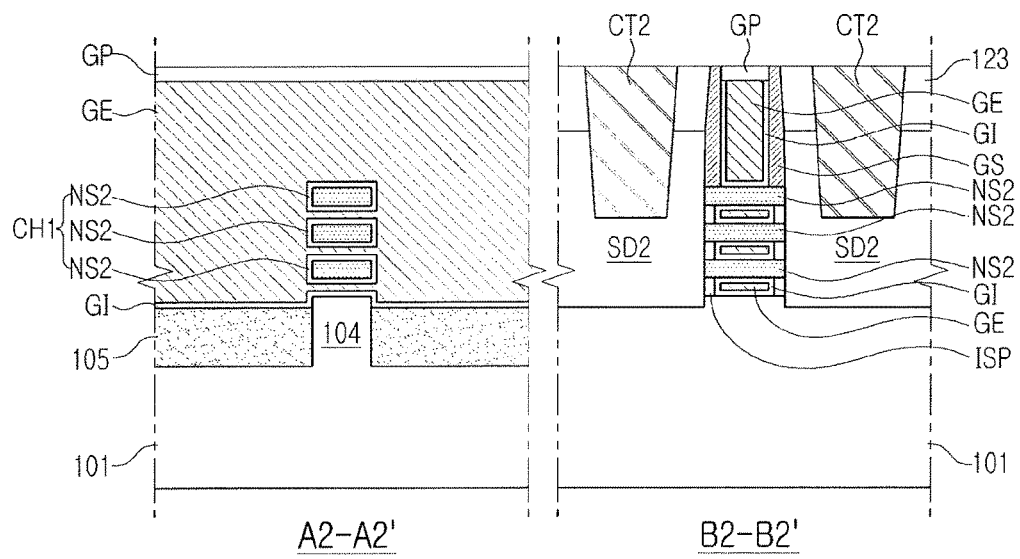
FIG. 2B illustrates cross-sectional views taken along line A2-A2' and line B2-B2' of FIG. 1.
Figure 2C:
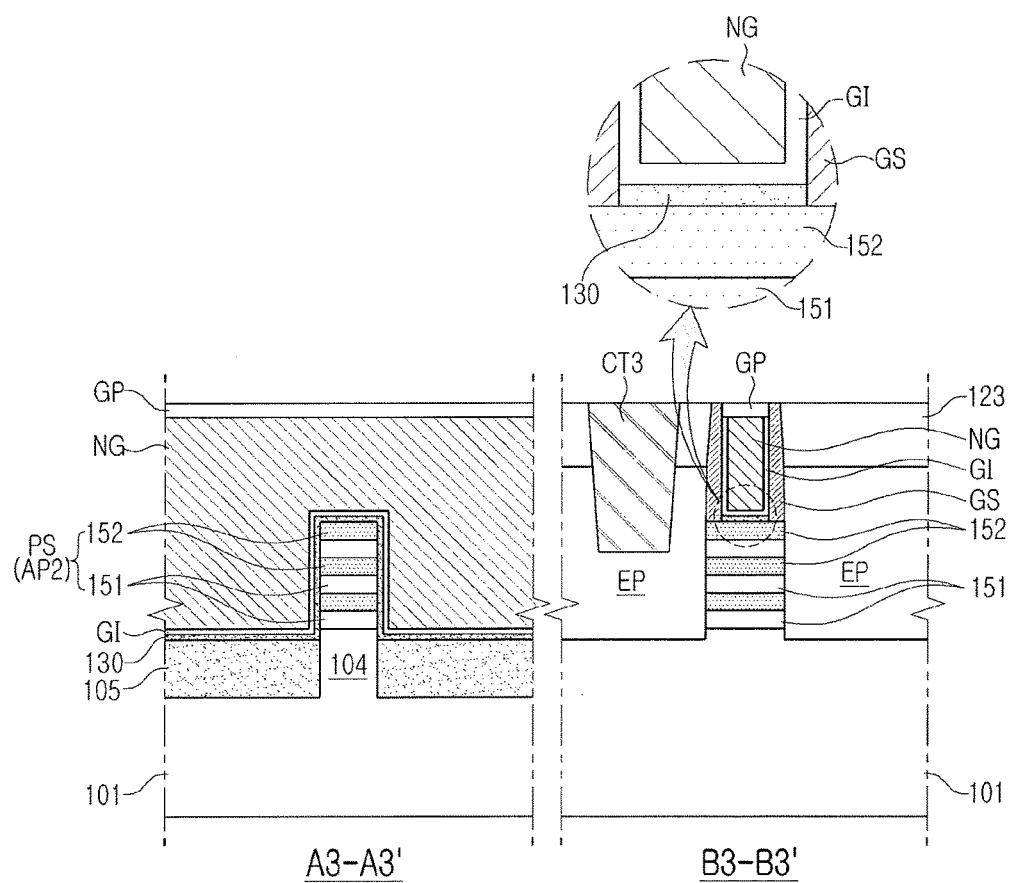
FIG. 2C illustrates cross-sectional views taken along line A3-A3' and line B3-B3' of FIG. 1.

FIG. 1 illustrates a plan view of a semiconductor device according to an example embodiment. FIG. 2A illustrates cross-sectional views taken along line A1-A1' and line B1-B1' of FIG. 1, FIG. 2B illustrates cross-sectional views taken along line A2-A2' and line B2-B2' of FIG. 1, and FIG. 2C illustrates cross-sectional views taken along line A3-A3' and line B3-B3' of FIG. 1.

Referring to FIG. 1, a semiconductor device 100 according to an example embodiment may include a substrate 101, a first transistor TR1 and a second transistor TR2 disposed on the substrate 101, as well as a non-active component NT (not forming a field effect transistor).

The substrate 101 may include a projection portion 104 extending (e.g., lengthwise) in a first direction (for example, an x-axis direction). A separation insulating layer 105 may be disposed on the substrate 101 to cover a side surface of the projection portion 104 of the substrate 101. An upper surface of the separation insulating layer 105 may be lower than (e.g., closer to the substrate 101 than) an upper surface of the projection portion 104. An upper portion of the projection portion 104 may protrude from or above the upper surface of the separation insulating layer 105. The projection portion 104 may be referred to as an active region. For example, the substrate 101 may be a semiconductor substrate such as a silicon substrate or a germanium substrate, or a silicon-on-insulator (SOI) substrate.

In an implementation, each of the first transistor TR1 and the second transistor TR2 may be provided as a field effect transistor having a multi-channel structure, while the non-active component NT may form a non-active component rather than a field effect transistor.

For example, the first transistor TR1 and the second transistor TR2 may be provided in or on a first region I, of the substrate 101, and the first region I of the substrate 101 may be a memory cell region in which a plurality of memory cells are formed, or a logic cell region in which logic transistors are disposed. For example, the first transistor TR1 and the second transistor TR2 may be a portion among memory cell transistors forming a plurality of SRAM cells. In an implementation, the first transistor TR1 and the second transistor TR2 may be a portion of logic transistors forming a processor core.

In an implementation, the non-active component NT may be provided to or on a second region II of the substrate, and the second region of the substrate 101 may be a peripheral circuit region. Herein, a 'non-active component' is used as the collective term not forming a field effect transistor but forming a peripheral circuit. The non-active component NT may be a component including a contact or an epitaxial layer for a contact, e.g., the non-active component may be a component such as another type of transistor, a bipolar transistor, or a power supply tap.

As illustrated in FIG. 1, the first transistor TR1 and the second transistor TR2 may be transistors having different conductivity types, formed in or on different conductive wells W1 and W2. The different conductive wells W1 and W2 may be divided by an isolation region ISO. The non-active component NT may be formed in or on a first conductive well W1 in the same manner as second transistors TR2.

For example, the first transistor TR1 may be a P-MOSFET formed in an n-type well W1, and the second transistor TR2 may be an N-MOSFET formed in a p-type well W2. The non-active component NT may be formed in the same p-type well W2 as that in which the second transistors TR2 are formed.

On the first region I of the substrate 101, the first transistor TR1 and the second transistor TR2 may include a first active region ACT1 and a second active region ACT2, extending in the first direction (for example, the x direction), respectively.

Each of the first transistor TR1 and the second transistor TR2 may include a plurality of gate structures extending in a second direction (for example, a y direction) intersecting the first direction.

In a manner similar thereto, on the second region II of the substrate 101, the non-active component NT may include a second active region ACT2 extending in the first direction x, and a gate structure extending in a second direction, intersecting the first direction.

On the first region I, in the first active region ACT1 and the second active region ACT2 related to the first transistor TR1 and the second transistor TR2, a first source/drain region SD1 and a second source/drain region SD2, as well as a first channel region CH1 and a second channel region CH2, located therebetween, may be formed, respectively. In an implementation, on the second region II, the second active region ACT2 related or corresponding to the non-active component NT has the epitaxial region EP, similar to the first source/drain region SDI and the second source/drain region SD2, while each of the first channel region CH1 and the second channel region CH2 has a fin structure PS. A detailed description thereof will be described below with reference to FIG. 2C.

FIGS. 2A and 2B illustrate cross-sectional views of a first transistor TR1 and a second transistor TR2, respectively.

Referring to FIGS. 2A and 2B in addition to FIG. 1, the gate structure may include a gate electrode GE, a gate insulator GI extending along a side wall and a bottom surface of the gate electrode GE, a pair of gate spacers GS spaced apart from the gate electrode GE with the gate insulator GI interposed therebetween, and a gate capping pattern GP covering the gate electrode GE and the gate insulator GI. An upper surface of the gate insulator GI and an upper surface of the gate electrode GE may be in contact with a bottom surface of the gate capping pattern GP.

The gate electrode GE may include a doped semiconductor, a conductive metal nitride, and/or a metal. For example, the gate electrode GE may include metal nitride such as TiN, WN, or TaN and/or a metal such as Ti, W, and Ta. For example, when a component is described as including a metal compound or a metal, the component may include the uncompounded, metallic metal. The gate insulator GI may include, e.g., a silicon oxide film, a silicon nitride film, a silicon oxynitride film, or a high dielectric constant film. The high dielectric constant film may include a material having a dielectric constant greater than that of a silicon oxide film, e.g. a hafnium oxide film (HfO), an aluminum oxide film (AlO), or a tantalum oxide film (TaO). Each of the gate spacer GS and the gate capping pattern GP may include at least one among a silicon oxide film, a silicon nitride film, and a silicon oxynitride film.

The first active region ACT1 may include first source/drain regions SD1 spaced apart from each other in the first direction (x direction), and a first channel region CHI connecting the first source/drain regions SD1. In a manner similar thereto, the second active region ACT2 may include second source/drain regions SD2 spaced apart from each other in the first direction, and a second channel region CH2 connecting the second source/drain regions SD2.

Referring to FIG. 2A, the first channel region CH1 may include a plurality of first channel layers NS1, arranged vertically. The first channel layers NS1 may be spaced apart from each other in a z direction, perpendicular to an upper surface of the substrate 101. The first source/drain regions SD1 may be directly in contact with side walls of the first channel layers NS1, respectively. For example, the first channel layers NS1 may allow the first source/drain regions SD1 to be connected to each other. In an implementation, e.g., as illustrated in FIG. 2A, three first channel layers NS1 may be included.

Referring to FIG. 2B, the second channel region CH2 may include a plurality of second channel layers NS2, vertically arranged or stacked. The second channel layers NS2 may be spaced apart from each other in the z direction, e.g., perpendicular to an upper surface of the substrate 101. The second source/drain regions SD2 may be directly in contact with side walls of the second channel layers NS2, respectively. For example, the second channel layers NS2 may allow the second source/drain regions SD2 to be connected to each other. In an implementation, e.g., as illustrated in FIG. 2B, three second channel layers NS2 may be included.

Each of the first channel layers NS1 and the second channel layers NS2 may be formed of a semiconductor pattern or material. For example, the semiconductor pattern may include Si, SiGe, or Ge. The first channel layers NS1 and the second channel layers NS2 may be formed from a semiconductor layer formed of or including the same substance. Thus, each of the first channel layers NS1 may be located at substantially the same level as that of each of the second channel layers NS2, while having substantially the same thickness as that of each of the second channel layers NS2. In an implementation, the first channel layers NS1 may each have the same thickness. In an implementation, the second channel layers NS2 may each have the same thickness.

As described previously, the gate electrode GE and the gate insulator GI may extend in the second direction y, while covering the first channel region CH1 and the second channel region CH2.

Referring to FIG. 2A, the gate electrode GE and the gate insulator GI may fill spaces between the first channel layers NS1. Here, the gate insulator GI may be directly in contact with the first channel layers NS1, and the gate electrode GE may be spaced apart from the first channel layers NS1 with the gate insulator GI interposed therebetween.

Referring to FIG. 2B, the gate electrode GE and the gate insulator GI may fill spaces between the second channel layers NS2. Here, the gate insulator GI may be directly in contact with the second channel layers NS2, and the gate electrode GE may be spaced apart from the second channel layers NS2 with the gate insulator GI interposed therebetween.

As a result, the gate electrode GE may surround an outer circumferential surface of each of the first channel layers NS1 and the second channel layers NS2. For example, each of the first transistor TR1 and the second transistor TR2 may form a gate-all-around field effect transistor or a field effect transistor having a multi-channel structure, including a channel region of which an outer circumferential surface is surrounded by the gate electrode GE.

Referring to FIG. 2C, the non-active component NT may have a similar gate structure, similar to a gate structure of each of the first transistor TR1 and the second transistor TR2. The similar gate structure of the non-active component NT may include a non-active electrode NG, a gate insulator GI, a pair of gate spacers GS, and a gate capping pattern GP. A blocking insulation film 130 may be disposed between the non-active electrode NG and the fin structure PS. The blocking insulation film 130 may include an insulating material such as silicon nitride or silicon oxynitride. In an implementation, the blocking insulation film 130 may include a first film including silicon oxide and a second film including silicon nitride. In an implementation, a material usable as the blocking insulation film 130 may be a material different from the first semiconductor patterns 151. For example, the blocking insulation film 130 may be a material in which an etching rate is low, under conditions in which the first semiconductor patterns 151 are etched. The non-active electrode NG may be formed of an electrode material the same as at least one of the first transistor TR1 and the second transistor TR2. In an implementation, a non-active electrode may be located on the blocking insulation film 130 and a multi-channel structure may not be formed. The non-active electrode may not act as a gate electrode like other gate electrodes.

Whether the blocking insulation film 130, employed in an example embodiment, is present, may be confirmed not only by means of a composition, but also by means of a formation region or by comparing a thickness thereof to a thickness of another gate insulating film GI. For example, the gate insulating film GI of each of the first transistor TR1 and the second transistor TR2 may be formed of a side surface of a gate spacer GI, while the blocking insulation film 130 of the non-active component NT may be formed not in the side surface of the gate spacer GI but in a region of an upper surface of the fin structure PS between the gate spacer GI. Thus, a portion of an insulating material in an upper surface of the fin structure PS of the non-active component NT may have a greater thickness than a thickness of the gate insulating film GI of each of the first transistor TR1 and the second transistor TR2, so that whether the blocking insulation film 130 employed to an example embodiment is present may be confirmed thereby.

As described previously, the non-active component NT may include the fin structure PS below the similar gate structure (here, the fin structure PS may be referred to as a second fin structure AP2 for convenience in the process description (see FIGS. 3 through 15B)). The fin structure PS may include the first semiconductor patterns 151 and the second semiconductor patterns 152, alternately arranged, in the z direction perpendicular to the upper surface of the substrate 101. For example, the first semiconductor patterns 151 may be alternately arranged with the second semiconductor patterns 152. The first semiconductor patterns 151 and the second semiconductor patterns 152 may be formed of materials having different etch selectivity. In an implementation, the first semiconductor pattern 151 may include SiGe or Ge, and the second semiconductor pattern 152 may include Si or a group III-V compound semiconductor.

The second semiconductor patterns 152 may be disposed on or at levels corresponding to those of at least one of the first channel layers NS1 and the second channel layers NS2, respectively. In an implementation, the second semiconductor patterns 152 may include the same semiconductor material as at least one of the first channel layers NS1 and the second channel layers NS2. For example, even when impurity concentrations are different from each other by a subsequent operation, and the like, the second semiconductor patterns 152 may be formed from the same semiconductor layer as the first channel layers NS1 and/or the second channel layers NS2. For example, the second semiconductor patterns 152 and the first channel layers NS1 and/or the second channel layers NS2 may include a silicon semiconductor.

The first semiconductor patterns 151 may be disposed at levels corresponding to those of spaces between channel layers of at least one of the first channel layers NS1 and the second channel layers NS2, respectively. The first semiconductor patterns 151 may be a pattern used as a sacrificial layer for the formation of the gate electrode GE between the first channel layers NS1 and the second channel layers NS2 in the first transistor TR1 and the second transistor TR2. In the non-active component NT employed to an example embodiment, as illustrated in FIG. 2C, even in a sacrificial layer removal operation (see FIGS. 14A and 14B), the first semiconductor patterns 151 may be protected by the blocking insulation film 130, and may thus remain without being removed.

In an implementation, as illustrated in the drawing figures, three second semiconductor patterns 152 may be included, in the same manner as the first channel layers NS1 and the second channel layers NS2, and three first semiconductor patterns 151 may be included.

Figure 9:
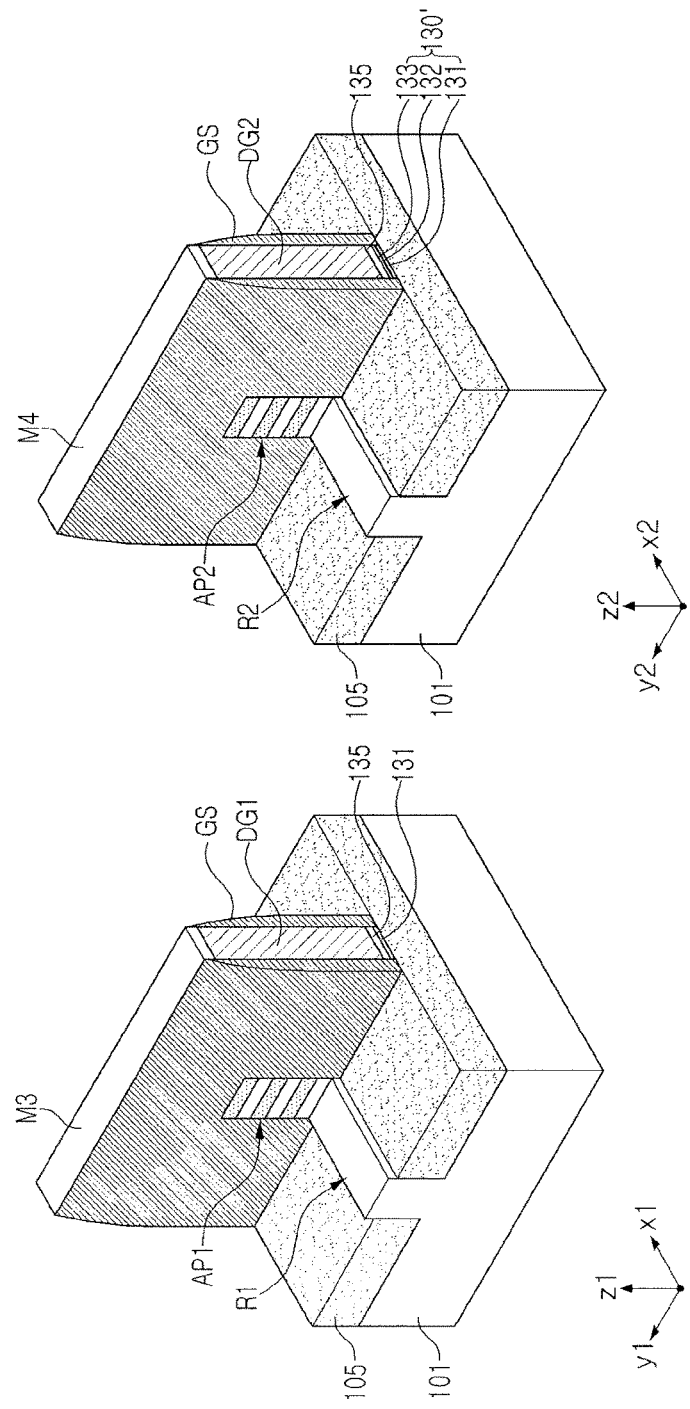
Figure 10:
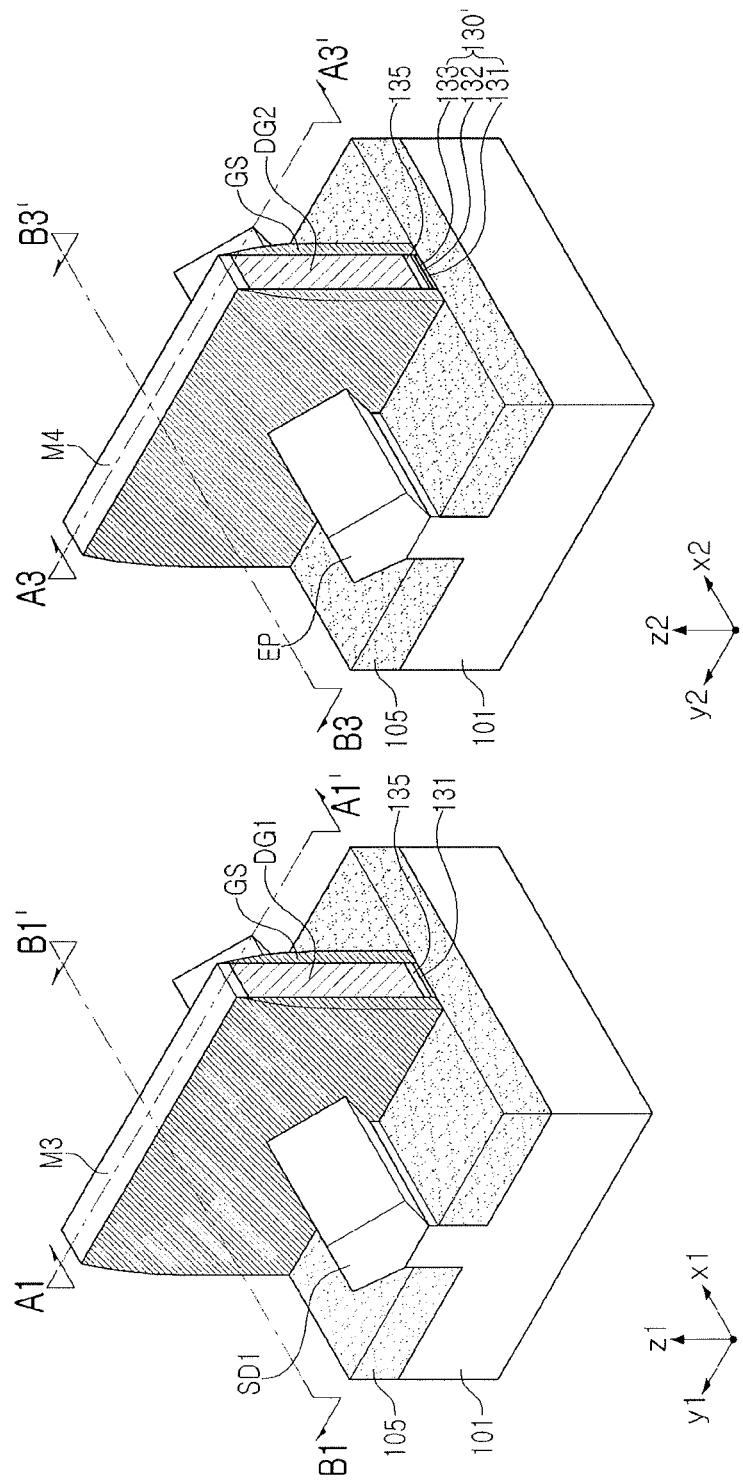

The first source/drain region SD1 and the second source/drain region SD2 may be epitaxial layers formed using a semiconductor layer, related or corresponding to the first channel layers NS1 and the second channel layers NS2, provided as a seed layer (see FIGS. 9 and 10).

When the first transistor TR1 is a P-MOSFET, the first source/drain regions SD1 may include a material providing compressive strain to the first channel region CH1. For example, the first source/drain regions SD1 may include a SiGe layer having a greater lattice constant than that of Si. The first source/drain regions SDI may have P-type conductivity.

When the second transistor TR2 is an N-MOSFET, the second source/drain regions SD2 may include a semiconductor material providing tensile strain to the second channel region CH2. For example, the second source/drain regions SD2 may include a SiC layer having a smaller lattice constant than that of Si, or a Si layer having a lattice constant substantially the same as that of the substrate 101. The second source/drain regions SD2 may have N-type conductivity.

Referring to FIG. 2C, the non-active component NT may include the epitaxial region EP adjacent to the fin structure PS. The epitaxial region EP may include the same semiconductor epitaxial portion as the first source/drain regions SD1 or second source/drain regions SD2. In an implementation, the epitaxial region EP may be a semiconductor epitaxial layer formed by the same operation as an operation of forming the first source/drain regions SD1. For example, the epitaxial region EP may be a SiGe epitaxial portion.

In an implementation, as illustrated in FIG. 2C, the epitaxial region EP may be disposed at both sides of the fin structure in the first direction (x direction) with the fin structure PS interposed therebetween, in a similar manner to the first source/drain regions SD1. In an implementation, the non-active component NT is not a component used as a field effect transistor, so the epitaxial region EP may be formed only at one side of the fin structure PS depending on the desired function.

In the non-active component NT of an example embodiment, as illustrated previously, the second semiconductor patterns 152 may not be etched (due to the presence of the blocking insulation film 130), so that damage to the epitaxial region EP caused by over-etching may be prevented. For example, damage to the epitaxial region EP could be a problem when the epitaxial region is located in a specific conductivity type region (e.g., a p-well region), in which an etching rate is relatively high. For example, as compared to an n-well region (W1 of FIG. 1) doped with an impurity such as phosphorus (P), an etching rate in a p-well region (W2 of FIG. 1) doped with an impurity such as boron (B), may be high, so the epitaxial region EP located in the non-active component NT located in the p-well region could easily be damaged.

The non-active component NT, as illustrated previously, may be used as a portion of a bipolar device (e.g., a collector) or a non-FET component not requiring a gate operation such as a power supply tap, so removal of the first semiconductor patterns 151 and formation of the gate electrode GE may not be required.

Thus, as illustrated in FIG. 2C, as the blocking insulation film 130 may be employed in an upper surface of the fin structure PS, the first semiconductor patterns 151 may be prevented from being etched in a formation operation of the gate electrode GE. As a result, the epitaxial region EP may be fundamentally protected from a damage caused by over-etching.

Meanwhile, in the second transistor TR2 located in the same conductive well (e.g., a p-type well) as the non-active component NT, second source/drain regions SD2 may be prevented from being damaged using internal spacers ISP in an operation of removing a sacrificial layer for formation of a gate electrode.

Referring to FIG. 2B, the second transistor TR2 employed in an example embodiment, in a different manner from the first transistor TR1, may include internal spacers ISP between the second source/drain regions SD2 and the gate electrode GE. The internal spacers ISP of the second transistor TR2 may be spaced apart from each other with the second channel layers NS2 interposed therebetween. The internal spacers ISP may be directly in contact with the gate insulator GI. For example, the internal spacers ISP may include at least one among a silicon oxide film, a silicon nitride film, and a silicon oxynitride film.

In an implementation, as illustrated in the drawing figures, the second transistor TR2 may include the internal spacers ISP. In an implementation, the first transistor TR1 may include the internal spacers ISP as desired.

An interlayer insulating film 123 may be provided on the first source/drain regions SD1 and the second source/drain regions SD2. The gate structure may be located in the interlayer insulating film 123. An upper surface of the interlayer insulating film 123 may substantially coplanar with an upper surface of the gate capping pattern GP. The interlayer insulating film 123 may include a silicon oxide film or a silicon oxynitride film.

First contact plugs CT1 and second contact plugs CT2 may be provided to pass through the interlayer insulating film 123, and to be connected to the first source/drain regions SD1 and the second source/drain regions SD2, respectively. The first contact plugs CT1 may be in contact with the first source/drain regions SD1, and the second contact plugs CT2 may be in contact with the second source/drain regions SD2. The non-active component NT may include a third contact plug CT3 connected to the epitaxial region EP in a manner similar thereto. As illustrated previously, the non-active component NT may be also used as a non-FET component, and thus may be only formed in one region of both epitaxial regions EP.

In the non-active component NT employed in an example embodiment, the epitaxial region EP may not be damaged, and may be protected by the blocking insulation film 130, so a good connection with the third contact plug CT3 may be ensured.

The first contact plugs CT1, the second contact plugs CT2, and the third contact plugs CT3 may include a conductive metal nitride and/or a metal. For example, the first contact plugs CT1, the second contact plugs CT2, and the third contact plugs CT3 may include metal nitride such as TiN, WN, and TaN, and/or a metal such as Ti, W, and Ta.

Hereinafter, a method of manufacturing a semiconductor device according to an example embodiment will be described with reference to the drawings.

FIGS. 3 through 15B illustrate perspective views and cross-sectional views of stages in a method of manufacturing a semiconductor device according to an example embodiment, and an operation of manufacturing a first transistor TR1 and a non-active component NT will be described as a main operation for convenience of explanation.

Figure 3:
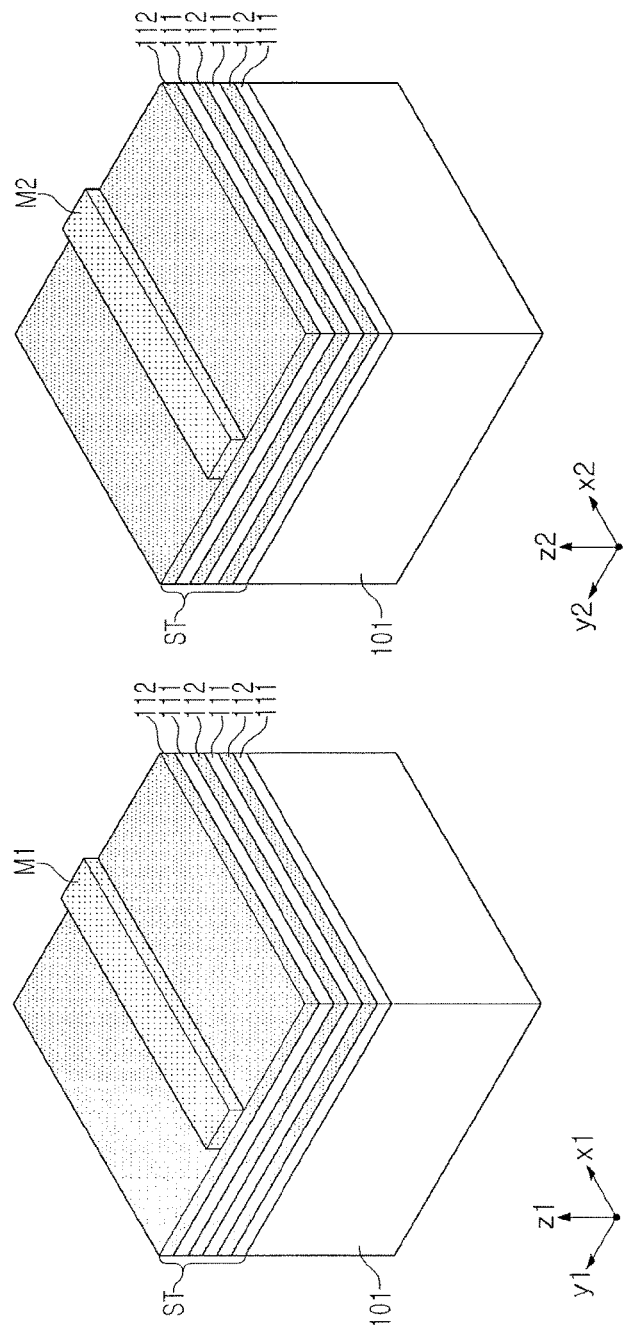
FIGS. 3 and 4 illustrate perspective views of a fin structure formation operation in a method of manufacturing a semiconductor device according to an example embodiment.
Figure 4:
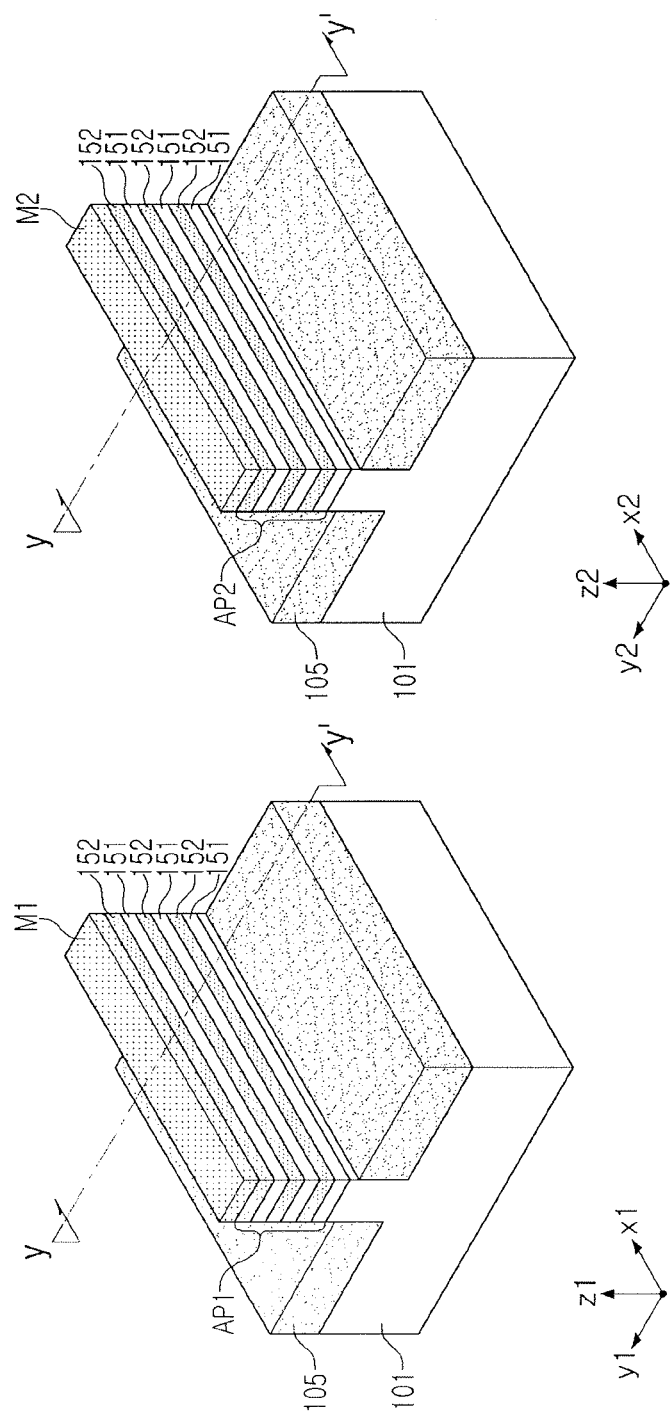

FIGS. 3 and 4 illustrate perspective views of a fin structure formation operation in a method of manufacturing a semiconductor device according to an example embodiment.

Referring to FIG. 3, a multilayer structure ST, in which a first semiconductor layer 111 and a second semiconductor layer 112 are alternately stacked on a substrate 101, may be formed.

The substrate 101 may include a first region I and a second region II. For example, the first region I may be a memory cell region, and the second region II may be a peripheral circuit region including a non-FET component. The second semiconductor layers 112 and the first semiconductor layers 111 may be alternately formed on the first semiconductor layer 111 in contact with the substrate 101. In an implementation, an uppermost layer of the multilayer structure ST may be a second semiconductor layer 112. In an implementation, the first semiconductor layers 111 and the second semiconductor layers 112 may be formed using, e.g., an epitaxial growth method.

The first semiconductor layers 111 and the second semiconductor layers 112 may include materials having different etch selectivity. For example, the first semiconductor layers 111 may be used as a sacrificial layer for formation of a gate electrode, and the second semiconductor layers 112 may be used as a channel layer. In this case, even when the first semiconductor layers 111 are etched, the second semiconductor layers 112 may remain while not being etched. In an implementation, the first semiconductor layers 111 may include, e.g., SiGe or Ge. In an implementation, the second semiconductor layers 112 may include, e.g., Si or a group III-V compound semiconductor.

Next, on the multilayer structure ST, a first mask pattern M1 and a second mask pattern M2, extending in first directions x1 and x2, respectively, may be formed thereon. The first mask pattern M1 and the second mask pattern M2 may be formed of, e.g., a silicon oxide film, a silicon nitride film, or a silicon oxynitride film.

Referring to FIG. 4, each of the first mask pattern M1 and the second mask pattern M2 may be used as a mask to etch the multilayer structure ST, so a first fin structure AP1 and a second fin structure AP2 may be formed.

In an implementation, the substrate 101 may be etched to a portion of an upper surface, so a projection portion 104, corresponding to the first fin structure AP1 and the second fin structure AP2, is formed, and a separation insulating layer 105 may be formed around the projection portion. A portion of a side surface of the projection portion 104 may be covered by the separation insulating layer 105. An upper surface of the separation insulating layer 105 may be lower than an upper surface of the projection portion 104 on the substrate 101. For example, the projection portion 104 on the substrate 101 may protrude above the separation insulating layer 105.

The first fin structure AP1 may be formed on the first region I and may extend in the first direction x1, and the second fin structure AP2 may be formed on the second region II and may extend in the first direction x2.

Each of the first fin structure AP1 and the second fin structure AP2 may include the first semiconductor patterns 151 and the second semiconductor patterns 152, alternately stacked, on each of the first region and the second region of the substrate 101.

Next, the first mask pattern M1 and the second mask pattern M2, located on the first fin structure AP1 and the second fin structure AP2, may be removed. Next, in a gate electrode formation operation, an operation of forming a blocking insulation film for protecting an epitaxial region of a non-active component may be performed.

FIGS. 5A through 5D illustrate cross-sectional views for each main operation of an example of a mask formation operation for a non-active component NT employed in an example embodiment, and may be understood as a cross-sectional view taken along y-y' of FIG. 4.

Figure 5A:
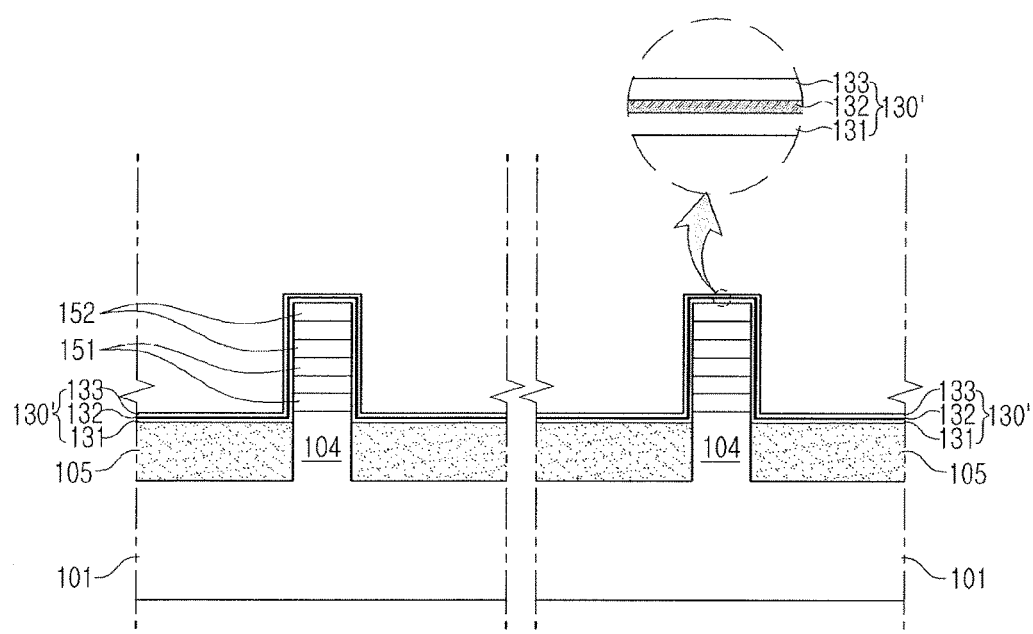
FIGS. 5A through 5C illustrate cross-sectional views of a mask layer formation operation in a method of manufacturing a semiconductor device according to an example embodiment.

Referring to FIG. 5A, a multilayer insulation film 130', covering the first fin structure AP1 and the second fin structure AP2, may be formed on the first region I and the second region II of the substrate 101.

The multilayer insulation film 130' may be formed conformally on the first fin structure AP1 and the second fin structure AP2 on the substrate 101. In an implementation, the multilayer insulation film 130' may include a nitride film such as silicon nitride, and may have a multilayer structure formed of materials having different selectivity. In an implementation, the multilayer insulation film 130' employed in an example embodiment may include a first film 131, silicon oxide, second film 132, silicon nitride, and a third film 133, silicon oxide.

The multilayer insulation film 130' may be formed using, e.g., chemical vapor deposition (CVD), physical vapor deposition (PVD), atomic layer deposition (ALD), or the like.

Figure 5B:
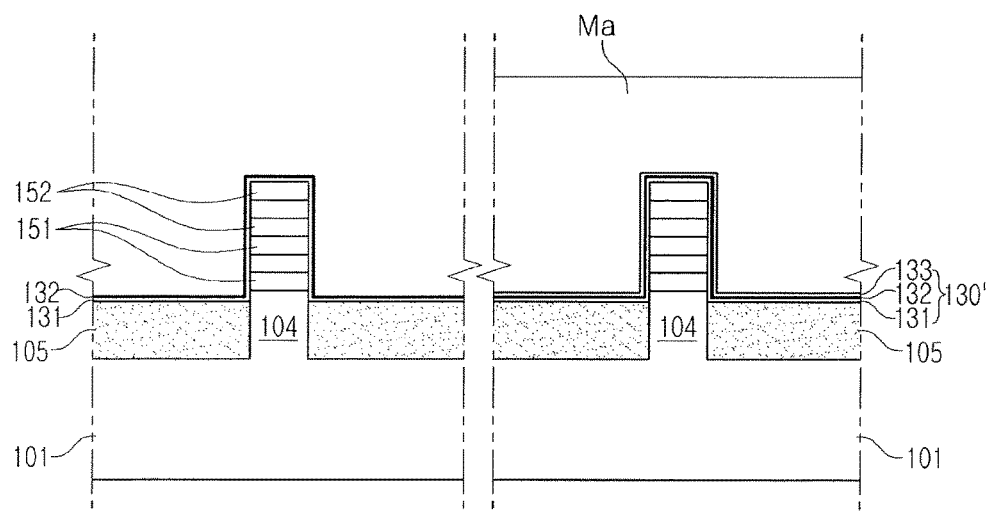

Next, referring to FIG. 5B, a first mask film Ma, covering the second fin structure AP2, may be formed in the second region II, and a selective etching process to silicon oxide may be performed using the first mask film Ma.

In the operation described above, the third film 133, silicon oxide, may be selectively removed from the multilayer insulation film 130', located on the first region I, and an outer surface may be provided as the second film 132, silicon nitride. In an implementation, the first mask film Ma may include, e.g., a photoresist, a spin-on-glass (SOG), or a spin-on hard mask (SOH).

Figure 5C:
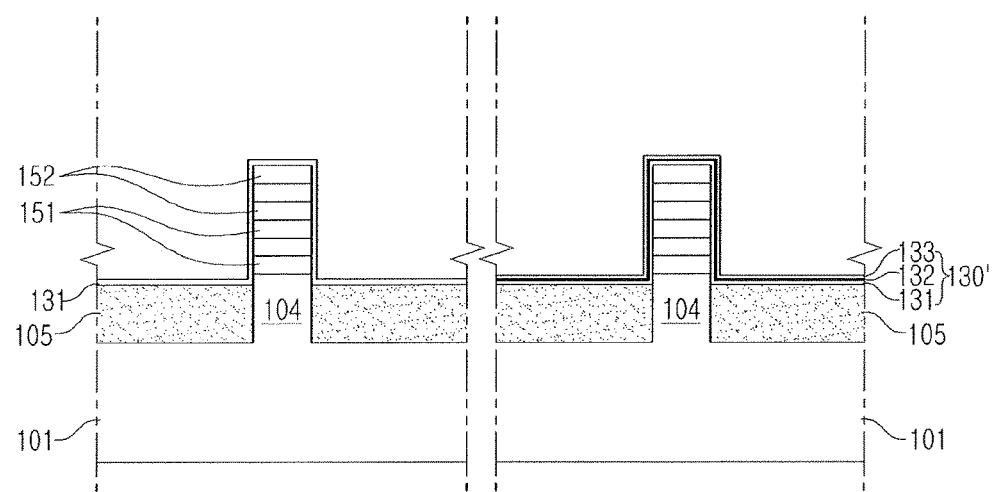

Next, referring to FIG. 5C, the first mask film Ma may be removed from the second region II, and a selective etching process to silicon nitride may be performed.

In the operation described above, the second film 132, silicon nitride and located on an outer surface, may be removed from the first region I, while the multilayer insulation film 130' located on the second region II, may remain (e.g., due to the presence of the third film 133, silicon oxide and located in an outer surface), without being removed. As a result, only the first film 131, silicon oxide, may remain in the first region I, and the multilayer insulation film 130' may be maintained in the second region II.

The multilayer insulation film, covering the second fin structure AP2 and remaining in the second region II, may be used as the blocking insulation film 130 preventing an epitaxial region, formed with source/drain regions in a subsequent gate electrode formation operation (e.g., a sacrificial layer removal operation), from being damaged.

In an implementation, with reference to FIGS. 5A through 5C, an operation of selectively forming a blocking insulation film in the second region II of the substrate 101 is illustrated. In an implementation, the method may include selectively forming a blocking insulation film capable of protecting a sacrificial layer of the second fin structure AP2 from a wet etching operation (sacrificial layer removal operation) for formation of a gate electrode, in the second region II.

FIGS. 6 through 10 illustrate perspective views of a formation operation of a dummy gate structure and a source/drain region in a method of manufacturing a semiconductor device according to an example embodiment.

Figure 6:
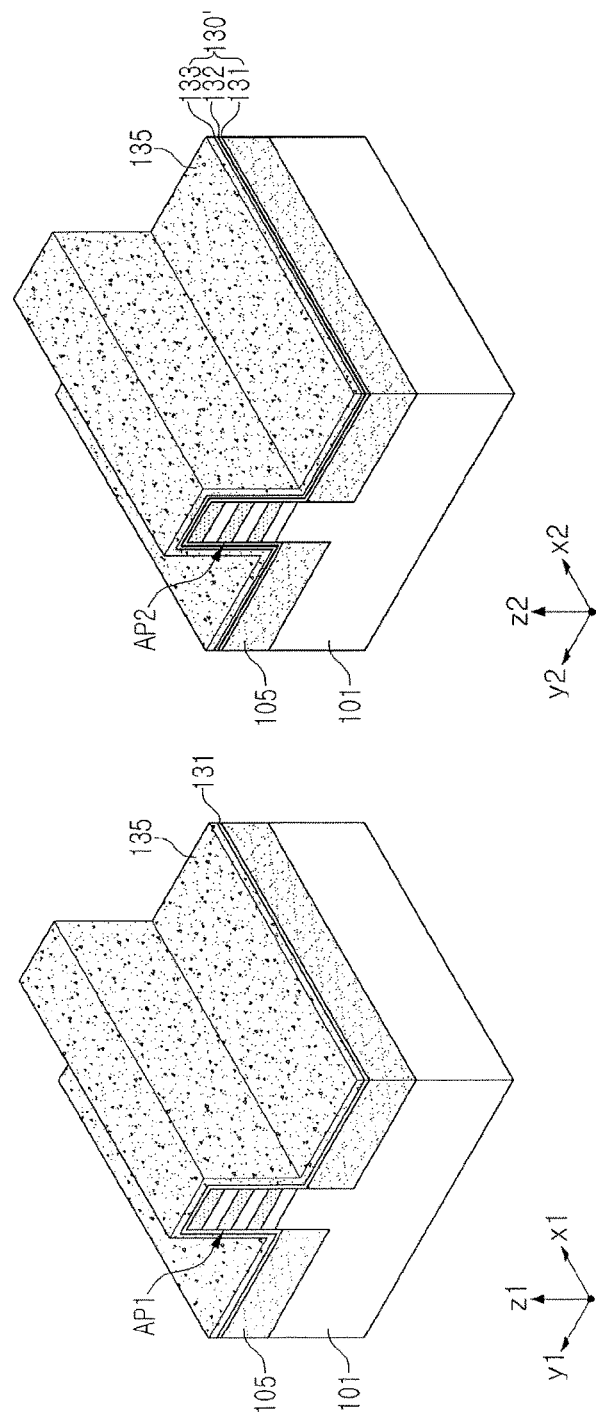
FIGS. 6 through 10 illustrate perspective views of a dummy gate structure and source/drain formation operation in a method of manufacturing a semiconductor device according to an example embodiment.
Figure 7:
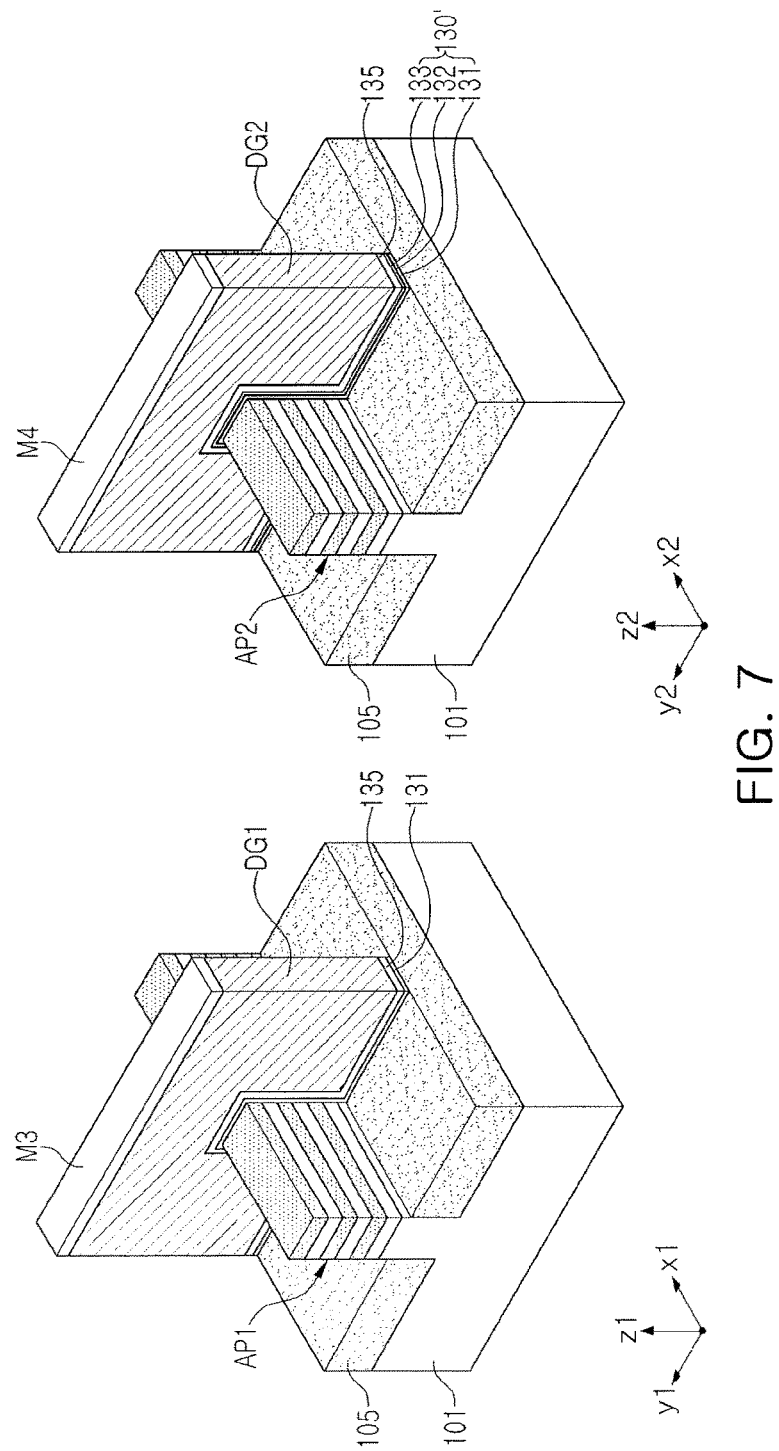

First, referring to FIGS. 6 and 7, buffering oxide layers 135, covering the first fin structure AP1 and the second fin structure AP2, may be additionally formed on the first region I and the second region II, respectively (see FIG. 6), and an etching operation may be performed using a third mask pattern M3 and a fourth mask pattern M4 to form a first dummy gate electrode DG1 and a second dummy gate electrode DG2.

The first dummy gate electrode DG1 may intersect the first fin structure AP1 to form a first dummy gate electrode DG1 extending in a second direction y1. In the etching operation, the first film 131, silicon oxide, and the buffering oxide layer 135 may be patterned with the first dummy gate electrode DG1.

The second dummy gate electrode DG2 may intersect the second fin structure AP2 to form a second dummy gate electrode DG2 extending in a second direction y2. In the etching operation, the blocking insulation film 130 and the buffering oxide layer 135 may be patterned with the second dummy gate electrode DG2. For example, each of the first dummy gate electrode DG1 and the second dummy gate electrode DG2 may be one of polysilicon or amorphous silicon.

Figure 8:
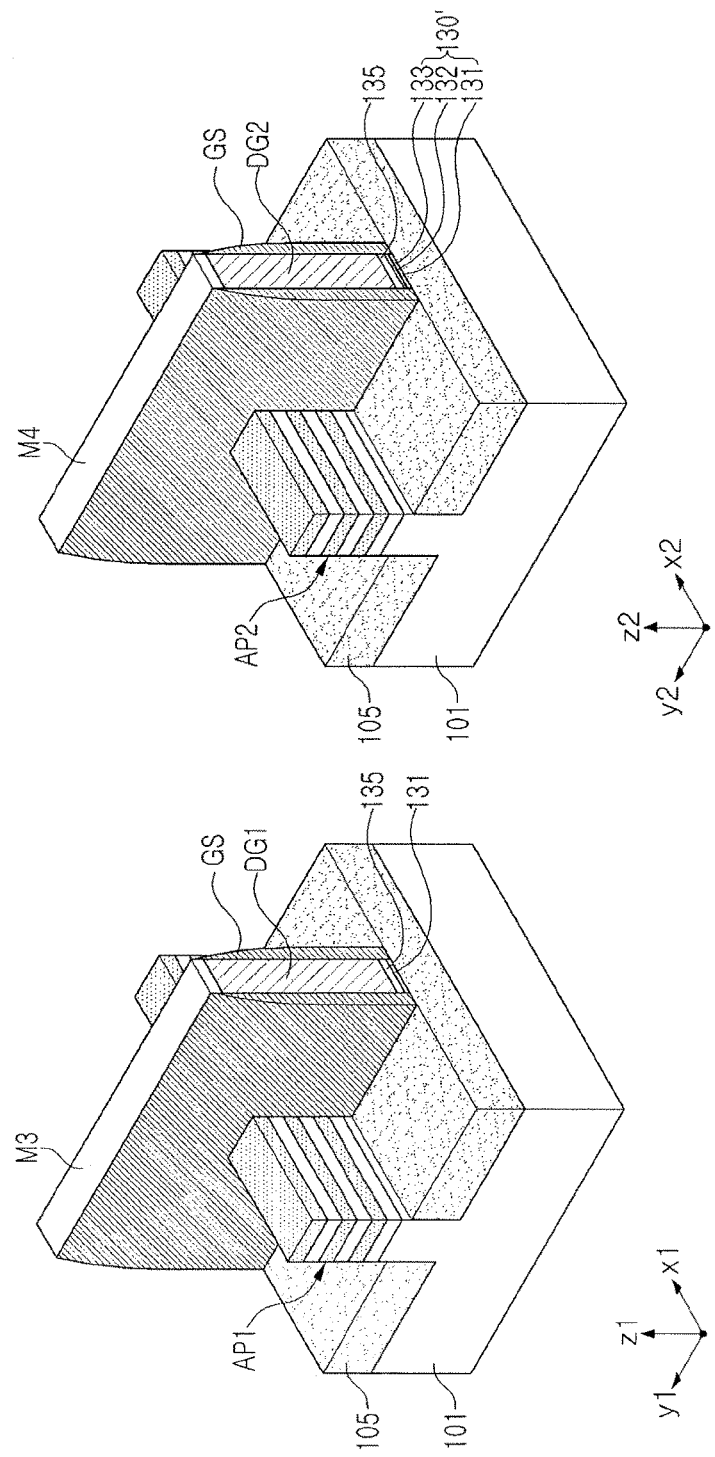

Next, referring to FIG. 8, gate spacers GS may be formed on side walls of the first dummy gate electrode DG1 and the second dummy gate electrode DG2.

For example, a spacer film, covering the first dummy gate electrode DG1, the second dummy gate electrode DG2, the first fin structure AP1, and the second fin structure AP2, may be formed on the substrate 101. Next, the spacer film may be etched-back to form a gate spacer GS remaining on a side wall of the first dummy gate electrode DG1 and a side wall of the second dummy gate electrode DG2.

The gate spacer GS may include, e.g., silicon nitride (SiN), silicon oxynitride (SiON), silicon oxide ($SiO_2$), silicon oxycarbonitride (SiOCN), or combinations thereof. In an implementation, the gate spacer GS may be a single film. In an implementation, the gate spacer GS may have a multifilm structure.

Next, referring to FIG. 9, portions of the first fin structure AP1, exposed to or at both sides of the first dummy gate electrode DG1 and the gate spacer GS, may be removed to form a first recess R1 in the first fin structure AP1. In a manner similar thereto, portions of the second fin structure AP2, exposed at both sides of the second dummy gate electrode DG2 and the gate spacer GS, may be removed to form a second recess R2 in the second fin structure AP2.

In an implementation, an operation of forming the first recess R1 and an operation of forming the second recess R2 may be simultaneously performed. In an implementation, while the first recess R1 and the second recess R2 are formed, a portion of the first semiconductor pattern 151, in contact with the substrate 101, may remain, so the portion may be used as an epitaxial seed. In an implementation, a portion of the first semiconductor pattern 151, in contact with the substrate 101, may be removed, so an upper surface of the substrate 101 may be exposed.

Through side surfaces of the first recess R1 and the second recess R2, the first semiconductor patterns 151 and the second semiconductor patterns 152, alternately stacked, may be exposed. In an implementation, an operation for forming an internal spacer may be additionally performed. For example, in the case of the second transistor TR2, after a recess is formed and before the second source/drain regions SD2 are formed, an operation of selectively forming the internal spacer ISP on a side surface of the first semiconductor patterns 151 may be performed.

Next, referring to FIG. 10, an epitaxial growth operation may be performed on the first fin structure AP1 and the second fin structure AP2 so as to fill the first recess R1 and the second recess R2. The epitaxial growth operation to fill the first recess R1 and the second recess R2 may be simultaneously performed through a single operation.

An epitaxial portion, growing at both sides of the first dummy gate electrode DG1, may be provided as the first source/drain regions SD1, and an epitaxial portion, growing at both sides of the second dummy gate electrode DG2, may be provided as the epitaxial region EP for contact of a non-active component.

The epitaxial growth operation described above may be performed, while a semiconductor surface, exposed to a bottom surface of each of the first recess R1 and the second recess R2, as well as the first semiconductor patterns 151 and the second semiconductor patterns 152, exposed to a side surface of each of the first recess RI and the second recess R2, are provided as seed layers.

The first source/drain regions SDI and the epitaxial region EP may include silicon germanium (SiGe) doped with a p-type impurity, and may thus provide a p-MOSFET. The first source/drain regions SDI may include a material capable of applying compressive stress to the second semiconductor pattern 152 used as a channel region of a P-MOSFET through a subsequent operation. The first source/drain regions SD1 may include a material having a greater lattice constant than that of the second semiconductor pattern 152. When the second semiconductor pattern 152 includes SiGe, the first source/drain regions SD1 may include SiGe, in which the content of Ge is greater than that of the second semiconductor pattern 152. The epitaxial region EP may be the same semiconductor epitaxial layer as the first source/drain regions SD1.

The first source/drain regions SD1 and the epitaxial region EP may have various shapes defined as a crystallographically stable surface in a growth process. For example, the first source/drain region SD1 and the epitaxial region EP may have a pentagonal cross section.

In an implementation, the second source/drain regions SD2 may be formed using another epitaxial growth operation, and may include silicon (Si) doped with an n-type impurity and/or silicon carbide (SiC). A cross section of the second source/drain region SD2 may have a hexagonal shape or a polygonal shape having a gentle angle.

Hereinafter, a gate structure formation operation in a method of manufacturing a semiconductor device according to an example embodiment will be described with reference to FIGS. 11A through 15B. FIGS. 11A, 12A, 13A, 14A, and 15A illustrate cross-sectional views taken along line B1-B1' and line B3-B3' for each main operation, while FIGS. 11B, 12B, 13B, 14B, and 15B illustrate cross-sectional views taken along line A1-A1' and line A3-A3' for each main operation.

Figure 11A:
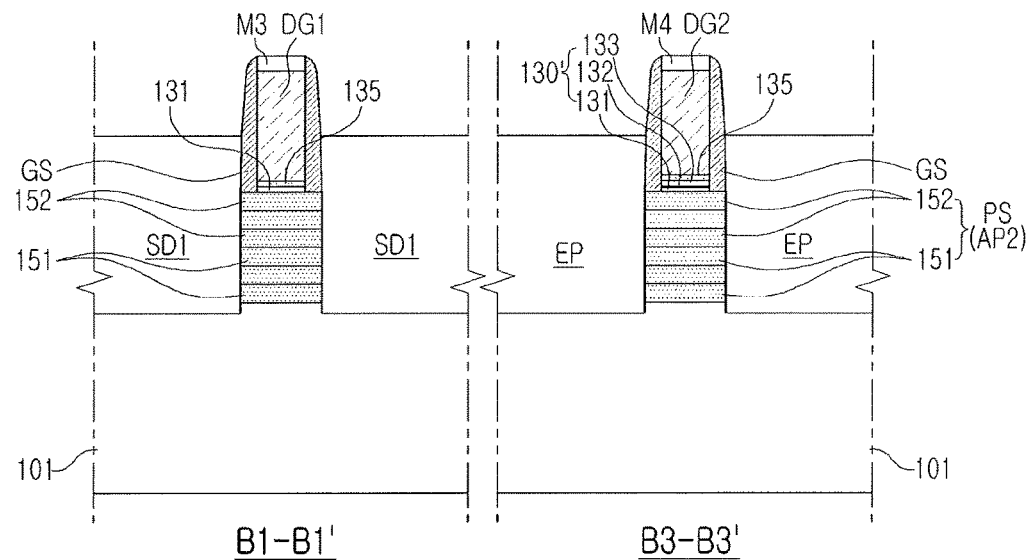
FIGS. 11A, 12A, 13A, 14A, and 15A illustrate cross-sectional views (B1-B1' and B3-B3') of a gate structure formation operation in a method of manufacturing a semiconductor device according to an example embodiment.
Figure 11B:
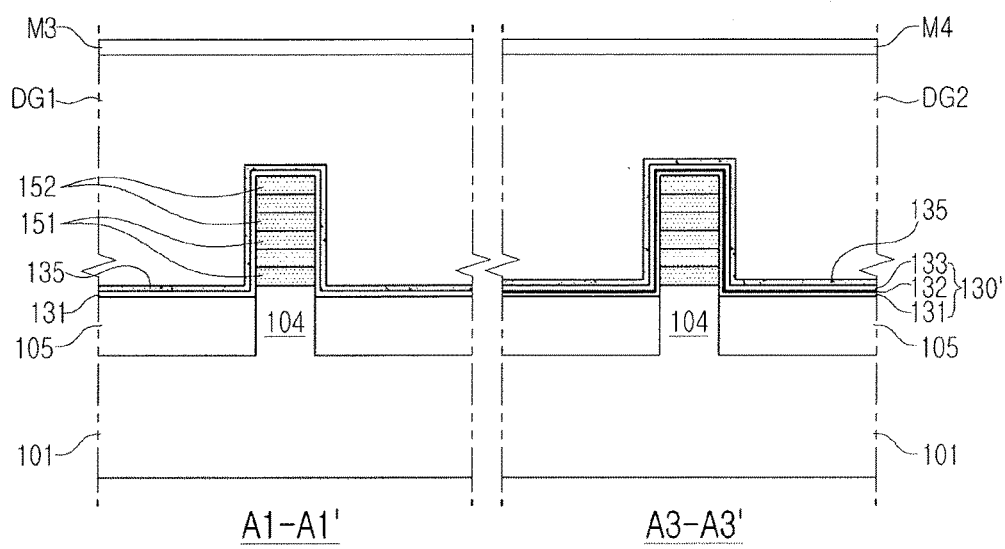
FIGS. 11B, 12B, 13B, 14B, and 15B illustrate cross-sectional views (A1-A1' and A3-A3') of a gate structure formation operation in a method of manufacturing a semiconductor device according to an example embodiment.

FIGS. 11A and 11B illustrate cross-sectional views taken along line B1-B1' and line B3-B3' and cross-sectional views taken along line A1-A1' and line A3-A3', of portions illustrated in FIG. 10.

Referring to FIGS. 11A and 11B, the first source/drain regions SD1 may be in contact with a side surface of the first fin structure AP1 located below the first dummy gate electrode DG1 and the gate spacer GS, e.g., the first semiconductor pattern 151 and the second semiconductor pattern 152. In a manner similar thereto, the epitaxial region EP may be in contact with a side surface of the second fin structure AP2 located below the second dummy gate electrode DG2 and the gate spacer GS.

Figure 12A:
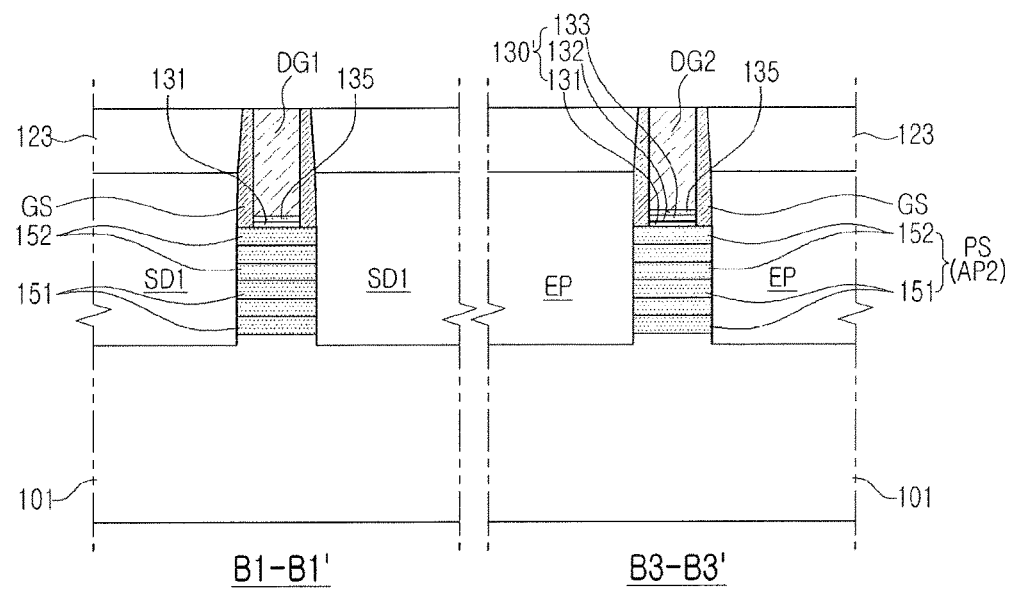
Figure 12B:
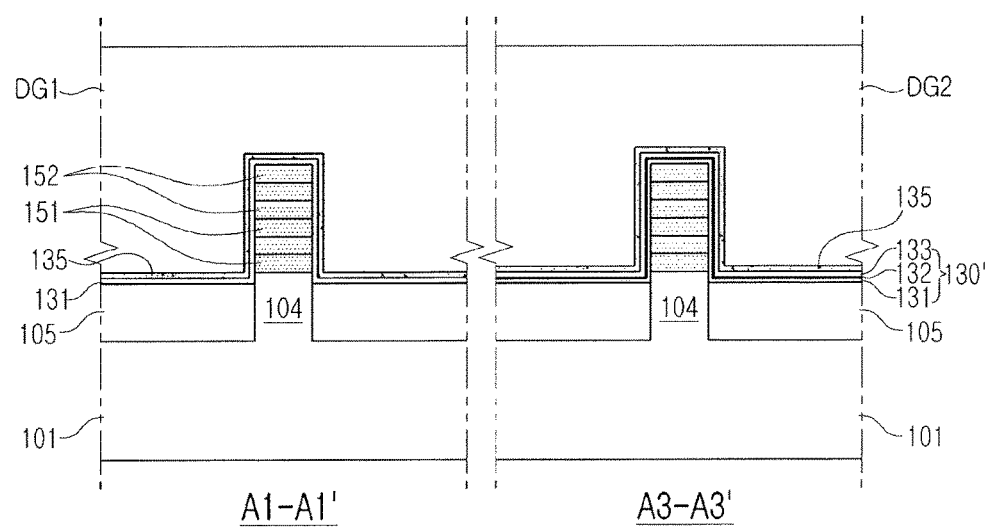

Next, referring to FIGS. 12A and 12B, the interlayer insulating film 123 may be formed to cover the first source/drain regions SD1, the first dummy gate electrode DG1, the epitaxial region EP, the second dummy gate electrode DG2, and the gate spacer GS may be formed on the substrate 101. Thereafter, until the first dummy gate electrode DG1 and the second dummy gate electrode DG2 are exposed, the interlayer insulating film 123 may be planarized.

In the planarization operation, the third mask pattern M3 and the fourth mask pattern M4 may be removed. The interlayer insulating film 123 may include, e.g., a low dielectric constant material, an oxide film, a nitride film, or an oxynitride film. The low dielectric constant material may include, e.g., flowable oxide (FOX), Tonen Silazane (TOSZ), undoped silica glass (USG), borosilica glass (BSG), phosphoxilica glass (PSG), borophosphosilica glass (BPSG), plasma enhanced tetra ethyl ortho silicate (PE-TEOS), fluoride silicate glass (FSG), high density plasma, (HDP) oxide, plasma enhanced oxide (PEOX), flowable CVD (FCVD) oxide, or combinations thereof.

Figure 13A:
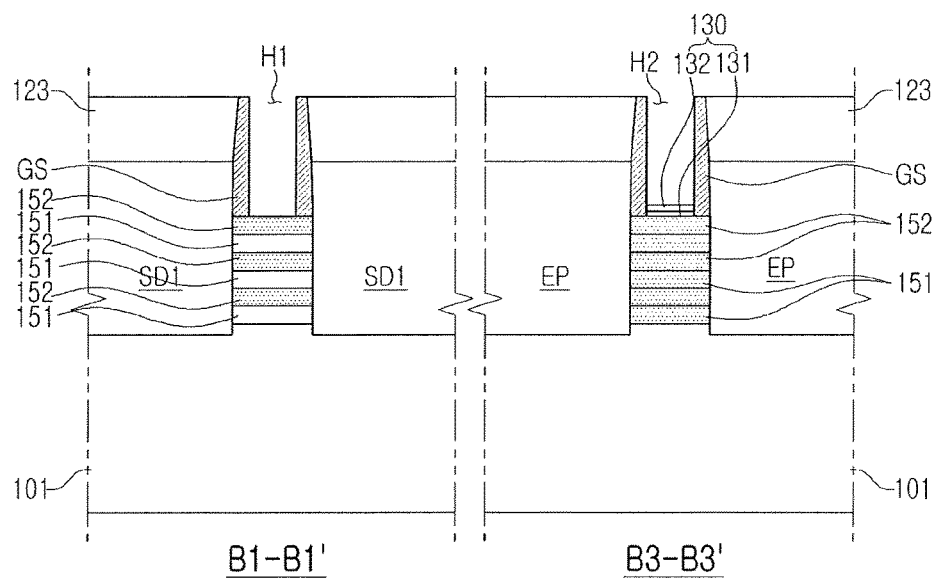
Figure 13B:
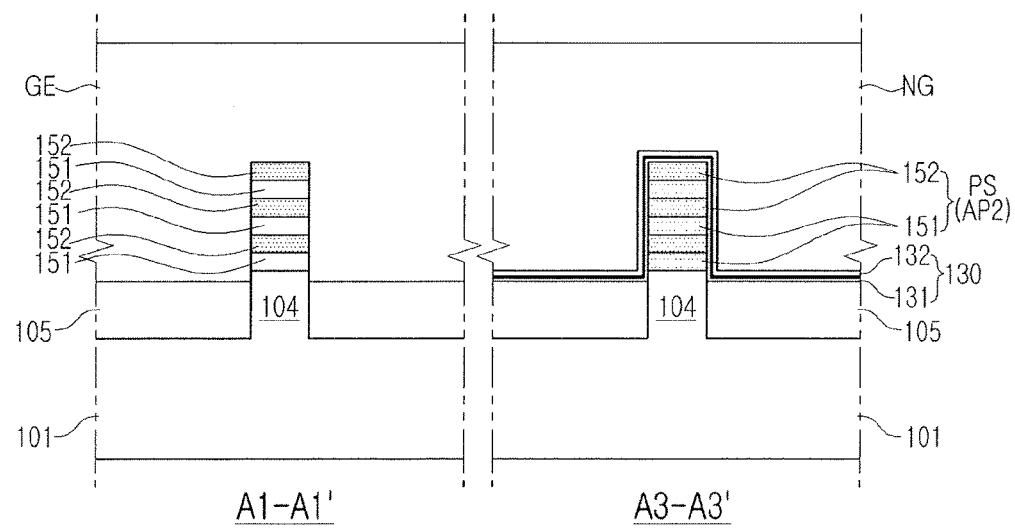

Next, referring to FIGS. 13A and 13B, the first dummy gate electrode DG1 and the second dummy gate electrode DG2 may be removed through an exposed region, and an oxide may be additionally selectively removed.

In the oxide removal operation, the first film 131, oxide, may be removed from the first region I, with the buffering oxide layer 135. The buffering oxide layer 135 may be removed from the second region II. In an implementation, the blocking insulation film 130 may remain due to the presence of the second film 132, which is nitride and which is located in a surface, without being removed.

As a result, as illustrated in FIG. 13B, a first open region H1 and a second open region H2 may be formed between gate spacers GS. Through the first open region H1, the first semiconductor patterns 151 and the second semiconductor patterns 152, of the first fin structure AP1, may be exposed. In the second open region H2, the second fin structure AP2 may remain covered by the blocking insulation film 130, so the second semiconductor patterns 152 may not be exposed.

Figure 14A:
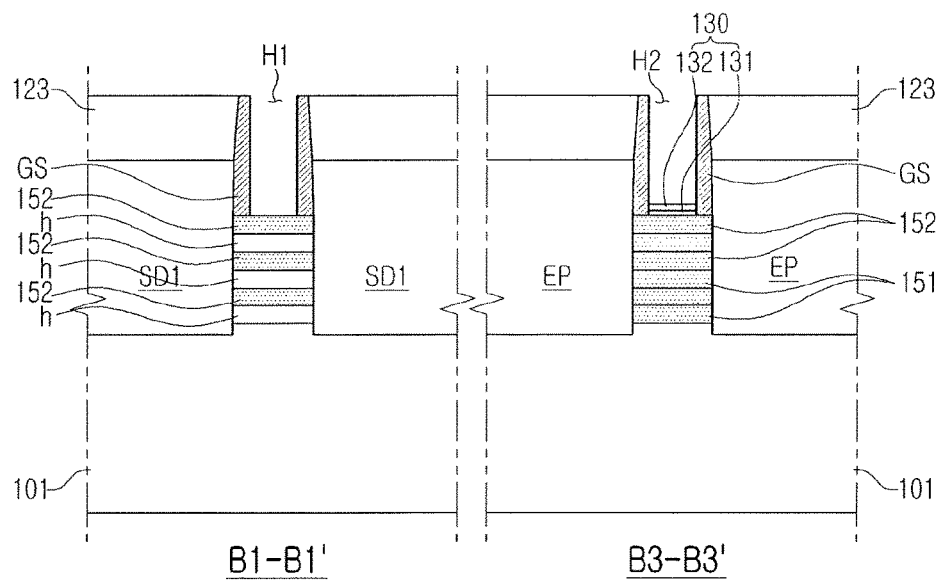
Figure 14B:
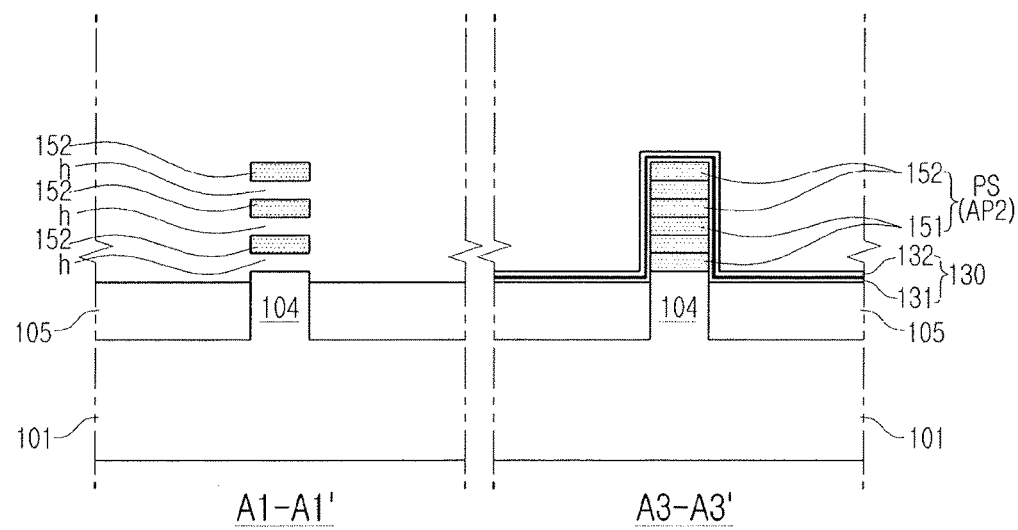

Next, referring to FIGS. 14A and 14B, on the first region I, by using an etchant in which an etching rate to the second semiconductor patterns 152 is higher than an etching rate to the first semiconductor patterns 151, the first semiconductor pattern 151 may be removed. A plurality of voids h, corresponding to the first semiconductor patterns 151, respectively, may be provided. In the operation described above, on the first region I, the second semiconductor patterns 152 may allow the first source/drain regions SD1 to be connected to each other in the first direction. The second semiconductor patterns 152 may be provided as a first channel layer NS1.

In an implementation, even when the same etching operation is applied to the second region II, the first semiconductor patterns 151 may not be exposed (due to the blocking insulation film 130), so the second fin structure AP2 may remain as is. Thus, by over-etching of the first semiconductor patterns 151, the epitaxial region EP may be fundamentally prevented from being damaged.

Figure 15A:
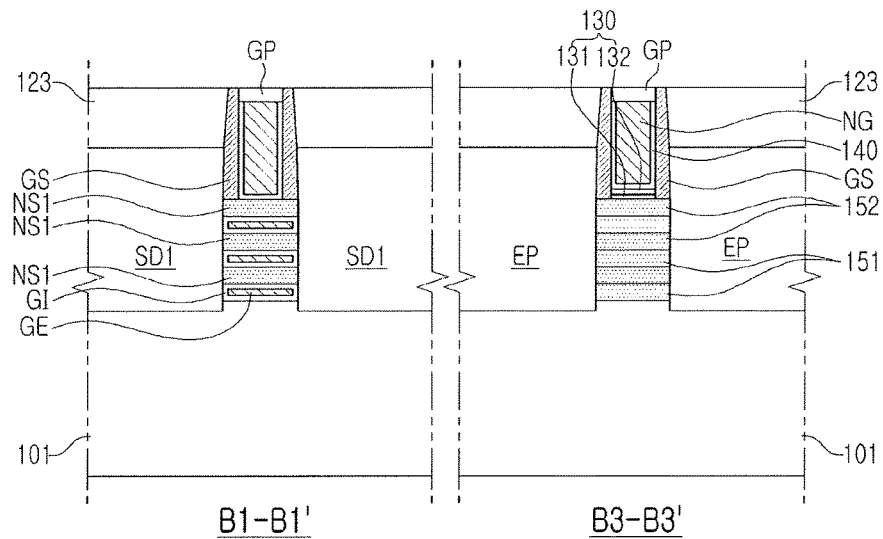
Figure 15B:
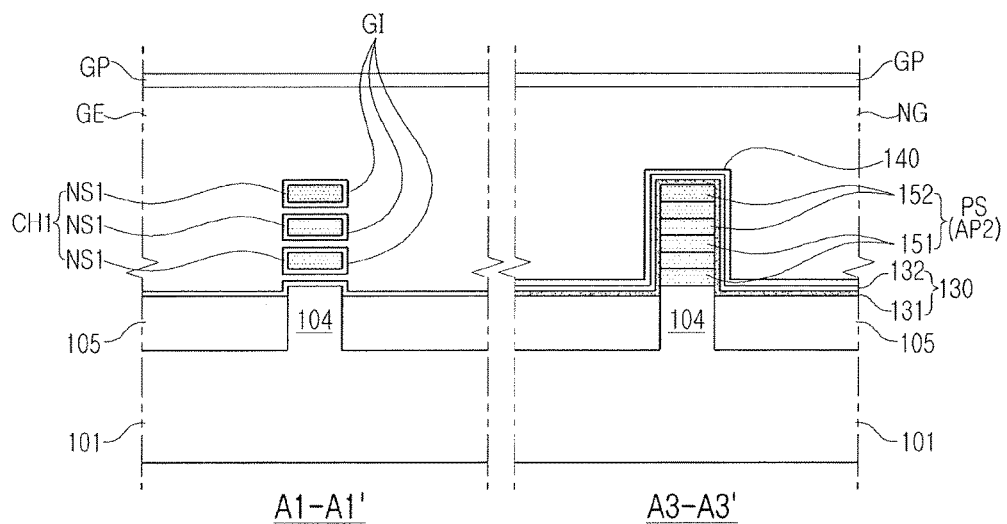

Next, referring to FIGS. 15A and 15B, on the first region I, the gate insulating film GI may be formed around the second semiconductor patterns 152, on a side wall of the gate spacer GS, and on the first source/drain regions SD1, having been exposed. In this case, the gate insulating film GI may be conformally formed around the first semiconductor pattern 151 and on a side wall of the gate spacer GS.

On the second region II, an insulating film 140, corresponding to the gate insulating film GI, may be formed on a side wall of the gate spacer GS and an upper surface of the blocking insulation film 130

Next, the gate electrode GE may be formed on the gate insulating film GI to extend in the second direction y1. For example, the gate electrode may be formed in a region between the gate spacers GS, in a region between the second semiconductor patterns 152, and in a region between the second semiconductor pattern 152 and the substrate 101.

On the second region II, the non-active electrode NG, e.g., the same electrode material as the gate electrode GE, may be formed between side walls of the gate spacer GS. In an implementation, the non-active electrode NG may be located on the blocking insulation film 130 and may not have a multi-channel structure, e.g., as previously illustrated. Thus, the non-active electrode NG may not act as a gate of a field effect transistor like other gate electrodes GE. The blocking insulation film 130 may include a nitride film such as silicon nitride or silicon oxynitride. In an implementation, the blocking insulation film 130 may include a first film 131 including silicon oxide and a second film 132 including silicon nitride.

A gate insulating film G1 may include a high dielectric constant material having a higher dielectric constant than that of a silicon oxide film. In an implementation, the gate insulating film G1 may include, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

The gate electrode GE and the non-active electrode NG may include a conductive material. In an implementation, each of the gate electrode GE and the non-active electrode NG may include, e.g., TiN, WN, TaN, Ru, TiC, TaC, Ti, Ag, Al, TiAl, TiAlN, TiAlC, TaCN, TaSiN, Mn, Zr, W, or Al. In an implementation, the gate electrode GE and the non-active electrode NG may have a single layer structure. In an implementation, the gate electrode GE may include a work function conductive layer adjusting a work function, and a filling conductive layer filling a space formed by a work function conductive layer adjusting a work function.

Additionally, a gate spacer GS and an etch-back operation may be applied to the gate electrode GE and the non-active electrode NG. After a gate capping layer is formed, a planarization operation may be performed to form a gate capping GP. In an implementation, the first contact plug CT1 connected to the first source/drain region SD1 and the third contact plug CT3 connected to the epitaxial region EP may be formed. Thus, the first transistor TR1 illustrated in FIG. 2A and the non-active component NT illustrated in FIG. 2C may be manufactured.

The non-active component NT according to an example embodiment may form a non-active component rather than a field effect transistor. The non-active component NT may be, e.g., a different transistor such as a bipolar transistor BJT, or a component such as a power supply tap.

In a gate electrode and gate insulating film formation operation, the epitaxial region EP to which a contact plug is connected may remain as is due to the presence of the blocking insulation film 130, while not being damaged. Moreover, in a gate electrode and gate insulating film formation operation, first semiconductor patterns and second semiconductor patterns, forming a fin structure, may remain as is, while not being removed.

Figure 16:
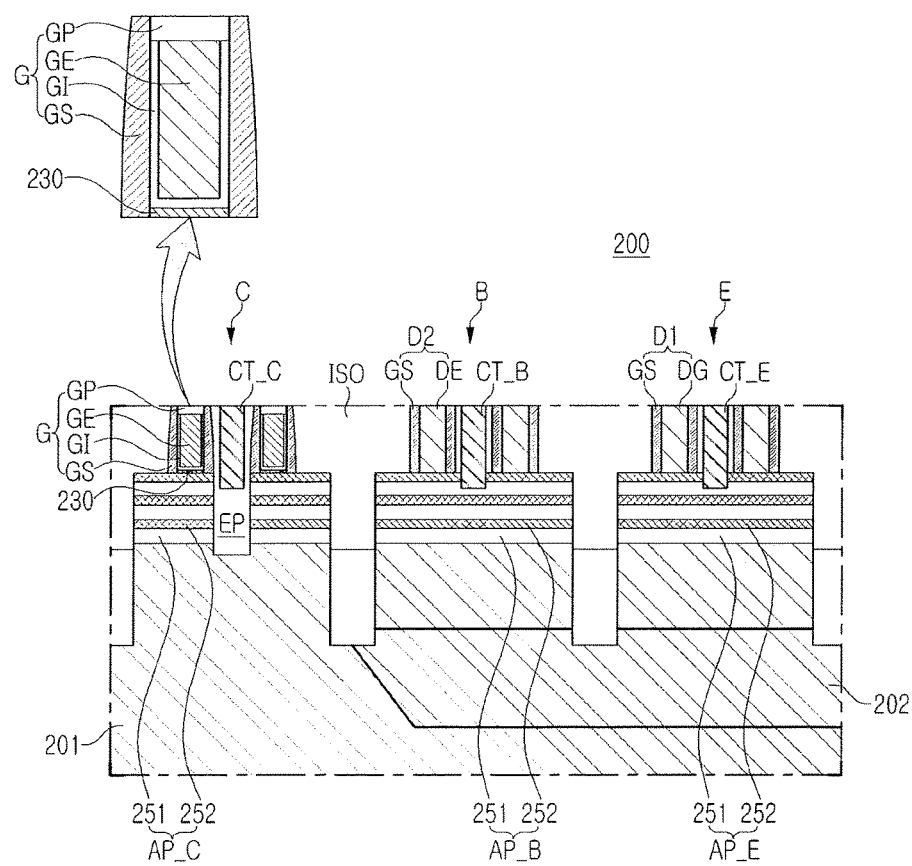
FIG. 16 illustrates a cross-sectional view of a PNP bipolar device applicable to a semiconductor device according to an example embodiment.

As a detailed example of a non-active component to be employed in an example embodiment, an example applied to a collector of a bipolar transistor is illustrated in FIG. 16. A bipolar transistor 200 illustrated in FIG. 16 may be understood as a component forming a peripheral circuit of the second region II in the semiconductor device illustrated in FIG. 1, rather than a field effect transistor forming a memory cell and a logic circuit, illustrated in FIG. 16.

Referring to FIG. 16, the bipolar transistor 200 may have a vertical PNP structure formed in a p-type semiconductor substrate 201 having an n-type impurity region 202.

A base region B and an emitter region E are provided on the n-type impurity region 202, and a collector region C is provided in a p-type semiconductor portion. The collector region C, the base region B, and the emitter region E may include a first fin structure AP_C, a second fin structure AP_B, and a third fin structure AP_E, in which first semiconductor patterns 251 and second semiconductor patterns 252 are alternately stacked, respectively, and may be separated from each other by a separation insulating layer ISO.

A p-type epitaxial region EP' may be formed in the first fin structure AP_C of the collector region C. The p-type epitaxial region EP' may be formed between two gate structures G. The operation described above may be described with reference to the operations illustrated in FIGS. 7 through 10. In the first fin structure AP_C, in an operation of removing a sacrificial layer so as to form the gate insulating film GI and the gate electrode GE, the second semiconductor patterns 252 remain by means of a blocking insulation film 230 while not being removed, so the p-type epitaxial region EP' may be prevented from being damaged. A first contact plug CT_C, connected to the p-type epitaxial region EP', is formed, so the collector region C may be formed.

Meanwhile, a separate epitaxial region is not formed in the second fin structure AP_B and the third fin structure AP_E, and an impurity injection operation to the second fin structure AP_B and the third fin structure AP_E is applied, so a semiconductor region having a specific conductivity type for the base region B and the emitter region E may be provided. For example, an n-type impurity is injected into the second fin structure AP_B, while a p-type impurity is injected into the third fin fin structure AP_E. Thus, a contact region for a second contact plug CT_B and a third contact plug CT_E may be provided. A gate electrode is not required in the base region B and the emitter region E, so a first dummy gate structure D1 and a second dummy gate structure D2, located in corresponding regions, respectively, may be maintained as a dummy gate electrode DG while a replacement operation is not applied.

As set forth above, according to example embodiments, while a sacrificial layer (for example, SiGe) is removed from a field effect transistor (FET) region, an epitaxial layer provided as a contact region in a non-active component (rather than a field effect transistor) may be prevented from being damaged, so a non-active component (e.g., a collector of a bipolar transistor (BJT) or a power supply tap) having a desired function may be stably provided.

By way of summation and review, semiconductor devices may be operated at high speed, while having high degrees of accuracy in operations, and optimizing a structure of a transistor included in a semiconductor device may be considered. For example, one scaling technique for increasing the density of integrated circuit devices, may include a multigate transistor, having a three-dimensional channel formed by providing an active pin on a substrate and forming a gate on the active pin.

The embodiments may provide a semiconductor device having a structure, in which an epitaxial layer, provided for contact in a non-transistor region, is not damaged.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a transistor disposed on a first region of a substrate, the transistor including:
source/drain regions,
a plurality of channel layers spaced apart from each other in a direction perpendicular to an upper surface of the substrate while connecting the source/drain regions, respectively,
a gate electrode surrounding each of the plurality of channel layers, and
a gate insulator between the gate electrode and the plurality of channel layers; and
a non-active component disposed on a second region of the substrate, the non-active component including:
a fin structure including a plurality of first semiconductor patterns alternately stacked with a plurality of second semiconductor patterns,
an epitaxial region adjacent to the fin structure,
a non-active electrode intersecting the fin structure, and
a blocking insulation film between the non-active electrode and the fin structure.

2. The semiconductor device as claimed in claim 1, wherein the blocking insulation film includes silicon nitride or silicon oxynitride.

3. The semiconductor device as claimed in claim 2, wherein the blocking insulation film includes a first film including silicon oxide and a second film including silicon nitride.

4. The semiconductor device as claimed in claim 1, wherein the plurality of second semiconductor patterns are located at a same level as respective ones of the plurality of channel layers.

5. The semiconductor device as claimed in claim 1, wherein the plurality of second semiconductor patterns and the plurality of channel layers include a same semiconductor material.

6. The semiconductor device as claimed in claim 1, wherein the non-active electrode and the gate electrode include a same electrode material.

7. The semiconductor device as claimed in claim 1, wherein the plurality of first semiconductor patterns and the epitaxial region include a same semiconductor material.

8. The semiconductor device as claimed in claim 1, wherein the epitaxial region includes a same semiconductor epitaxial portion as the source/drain regions.

9. The semiconductor device as claimed in claim 8, wherein the epitaxial region includes silicon germanium (SiGe).

10. The semiconductor device as claimed in claim 1, wherein:
the first region of the substrate includes an N-well,
the second region of the substrate includes a P-well, and
the transistor is a P-channel metal oxide semiconductor (P-MOS) transistor.

11. The semiconductor device as claimed in claim 1, further comprising a contact plug connected to the epitaxial region.

12. The semiconductor device as claimed in claim 1, wherein the non-active component is a portion of a bipolar transistor or a power supply tap.

13. A semiconductor device, comprising:
a transistor on a first region of a substrate, the transistor including:
source/drain regions arranged in a first direction,
a plurality of channel layers arranged in a direction perpendicular to an upper surface of the substrate and spaced apart from each other while connecting the source/drain regions,
a gate electrode extending in a second direction, intersecting the first direction, while surrounding the plurality of channel layers, and
a gate insulator between the gate electrode and the plurality of channel layers;
a non-active component on a second region of the substrate, the non-active component including:
a fin structure including a plurality of first semiconductor patterns alternately stacked with a plurality of second semiconductor patterns,
an epitaxial region disposed in the first direction and adjacent to the fin structure,
a non-active electrode extending in the second direction while intersecting the fin structure, and
a blocking insulation film between the non-active electrode and the fin structure, the blocking insulation film being formed of a material different from that of the first semiconductor patterns; and
a plurality of contact plugs connected to the source/drain regions and the epitaxial region.

14. The semiconductor device as claimed in claim 13, wherein:
the transistor further includes first gate spacers on both side surfaces of the gate electrode facing in the second direction, and
the non-active component further includes second gate spacers on both side surfaces of the non-active electrode facing in the second direction.

15. The semiconductor device as claimed in claim 14, wherein the blocking insulation film is on a region of the fin structure located between the second gate spacers.

16. The semiconductor device as claimed in claim 14, wherein:
the fin structure includes a plurality of fin structures arranged in the second direction, and
the epitaxial region is between fin structures of the plurality of fin structures.

17. The semiconductor device as claimed in claim 13, wherein the epitaxial region includes epitaxial regions on both sides of the fin structure facing in the first direction with the fin structure interposed therebetween.

18. A semiconductor device, comprising:
a first transistor on a first conductive well of a substrate, the first transistor including:
first source/drain regions,
a plurality of first channel layers spaced apart from each other in a direction perpendicular to an upper surface of the substrate while connecting the first source/drain regions, respectively,
a first gate electrode surrounding each of the plurality of first channel layers, and
a first gate insulator between the first gate electrode and the plurality of first channel layers;
a second transistor on a second conductive well of the substrate, the second transistor including:
second source/drain regions,
a plurality of second channel layers spaced apart from each other in the direction perpendicular to the upper surface of the substrate while connecting the second source/drain regions, respectively,
a second gate electrode surrounding each of the plurality of second channel layers, and
a second gate insulator between the second gate electrode and the plurality of second channel layers; and
a non-active component on the second conductive well of the substrate, the non-active component including:
a fin structure including a plurality of first semiconductor patterns alternately stacked with a plurality of second semiconductor patterns,
an epitaxial region adjacent to the fin structure,
a non-active electrode disposed to intersect the fin structure, and
a blocking insulation film between the non-active electrode and the fin structure, the blocking insulation film being formed of a material that is different from that of the first semiconductor patterns.

19. The semiconductor device as claimed in claim 18, wherein the second transistor further includes an internal spacer between the second gate electrode and the second source/drain regions.

20. The semiconductor device as claimed in claim 18, wherein the epitaxial region of the non-active component includes a semiconductor epitaxial portion that is the same as the first source/drain regions of the first transistor.

* * * * *